United States Patent [19]

Hanzawa et al.

[11] Patent Number: 4,864,625
[45] Date of Patent: Sep. 5, 1989

[54] EFFECTOR FOR ELECTRONIC MUSICAL INSTRUMENT

[75] Inventors: Kohtaro Hanzawa; Shigenori Morikawa; Kazuhisa Nakamura, all of Tokyo, Japan

[73] Assignee: Casio Computer Co., Ltd., Tokyo, Japan

[21] Appl. No.: 902,513

[22] Filed: Sep. 2, 1986

[30] Foreign Application Priority Data

| Sep. 13, 1985 | [JP] | Japan | 60-202698 |
|---|---|---|---|
| Sep. 13, 1985 | [JP] | Japan | 60-202700 |
| Sep. 14, 1985 | [JP] | Japan | 60-203791 |
| Sep. 18, 1985 | [JP] | Japan | 60-205516 |
| Sep. 18, 1985 | [JP] | Japan | 60-205517 |
| Sep. 19, 1985 | [JP] | Japan | 60-207147 |
| Sep. 19, 1985 | [JP] | Japan | 60-207150 |
| Sep. 27, 1985 | [JP] | Japan | 60-214311 |

[51] Int. Cl.$^4$ .................................. H03G 3/00
[52] U.S. Cl. ........................ 381/61; 84/603; 84/604
[58] Field of Search .................. 381/61, 62, 63; 84/DIG. 4, DIG. 26, 1.19, 1.22, 1.24, 1.26, 1.01, 1.03, 1.28

[56] References Cited

U.S. PATENT DOCUMENTS

| 3,999,458 | 12/1976 | Suzuki | 84/1.01 |
|---|---|---|---|
| 4,148,239 | 4/1979 | Oya et al. | 84/1.03 |
| 4,581,759 | 4/1986 | Takahashi | 381/63 |
| 4,584,704 | 4/1986 | Nakama et al. | 381/63 |
| 4,586,417 | 5/1986 | Kato et al. | 381/63 |
| 4,628,789 | 12/1986 | Fujimori | 381/63 |
| 4,633,749 | 1/1987 | Fujimori et al. | 84/1.28 |
| 4,667,556 | 5/1987 | Hanzawa et al. | 84/1.28 |
| 4,681,008 | 7/1987 | Morikawa et al. | 84/1.28 |

FOREIGN PATENT DOCUMENTS 2023955 1/1980 United Kingdom .

*Primary Examiner*—Forester W. Isen
*Attorney, Agent, or Firm*—Frishauf, Holtz, Goodman & Woodward

[57] ABSTRACT

An input waveform signal is converted in an A/D converter into a digital signal to be written in a waveform memory under control of a tone generation control unit. The written digital signal is read out from the waveform memory with a designated delay time. The input waveform signal and the digital signal read out from the waveform memory are converted in a D/A converter into analog signals which are fed through VCFs and VCAs so as to be sounded. Further, in the above arrangement the timbre and tone volume controls are done independently for the individual waveform read/write channels through VCFs 12a to 12d and VCAs 13a to 13d. Thus, it is possible to obtain a further effected sound.

16 Claims, 18 Drawing Sheets

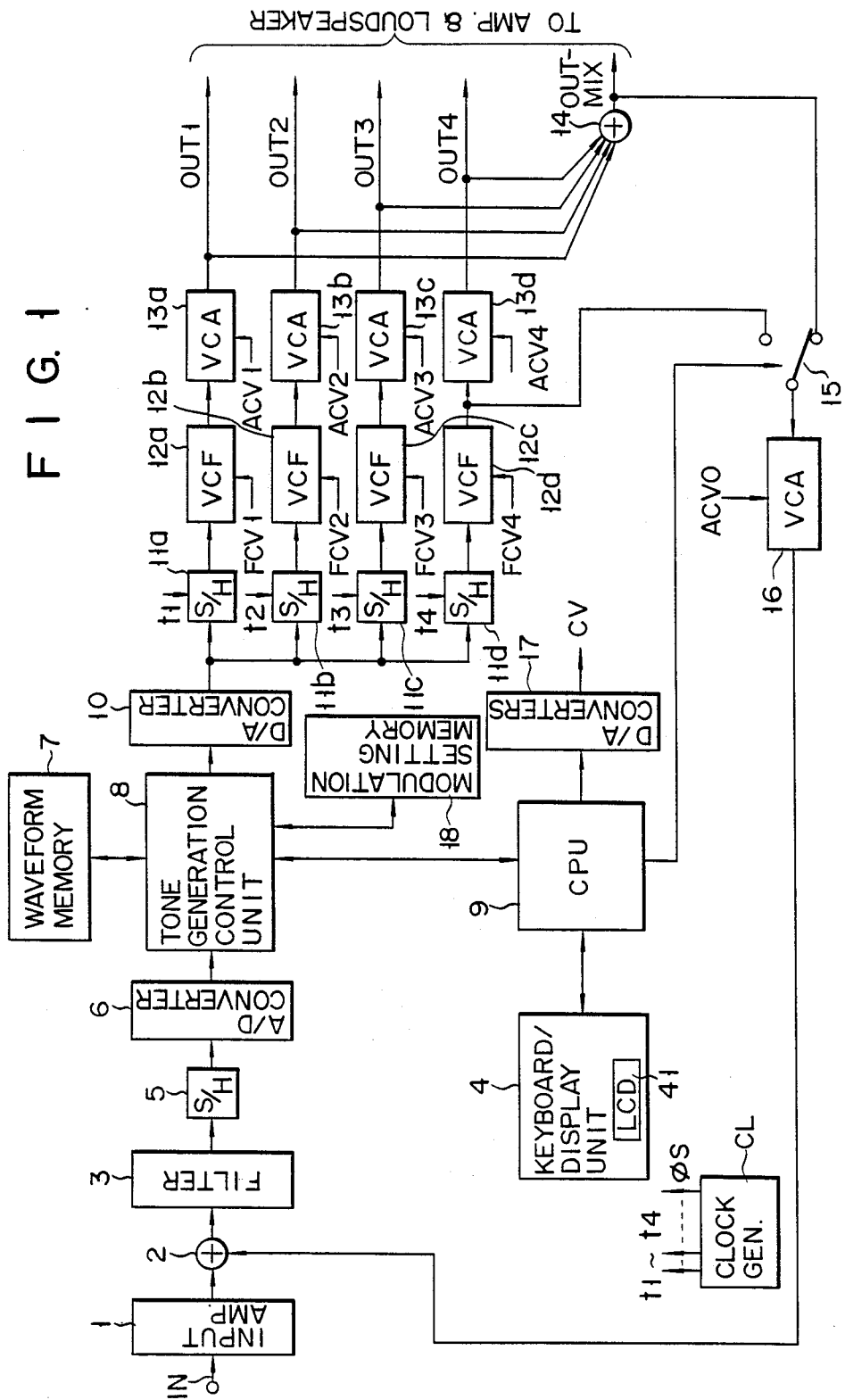

F I G. 9

| CHANNEL (j) | INITIAL ADDRESS (CAj) |
|---|---|
| 2 | n − 2 · 5 |
| 3 | n − 5 · 0 |
| 4 | n − 10 · 0 |

F I G. 10

| CHANNEL (j) | INITIAL ADDRESS (CAj) |
|---|---|
| 2 | n − 10 |
| 3 | n − 20 |
| 4 | n − 40 |

FIG. 13

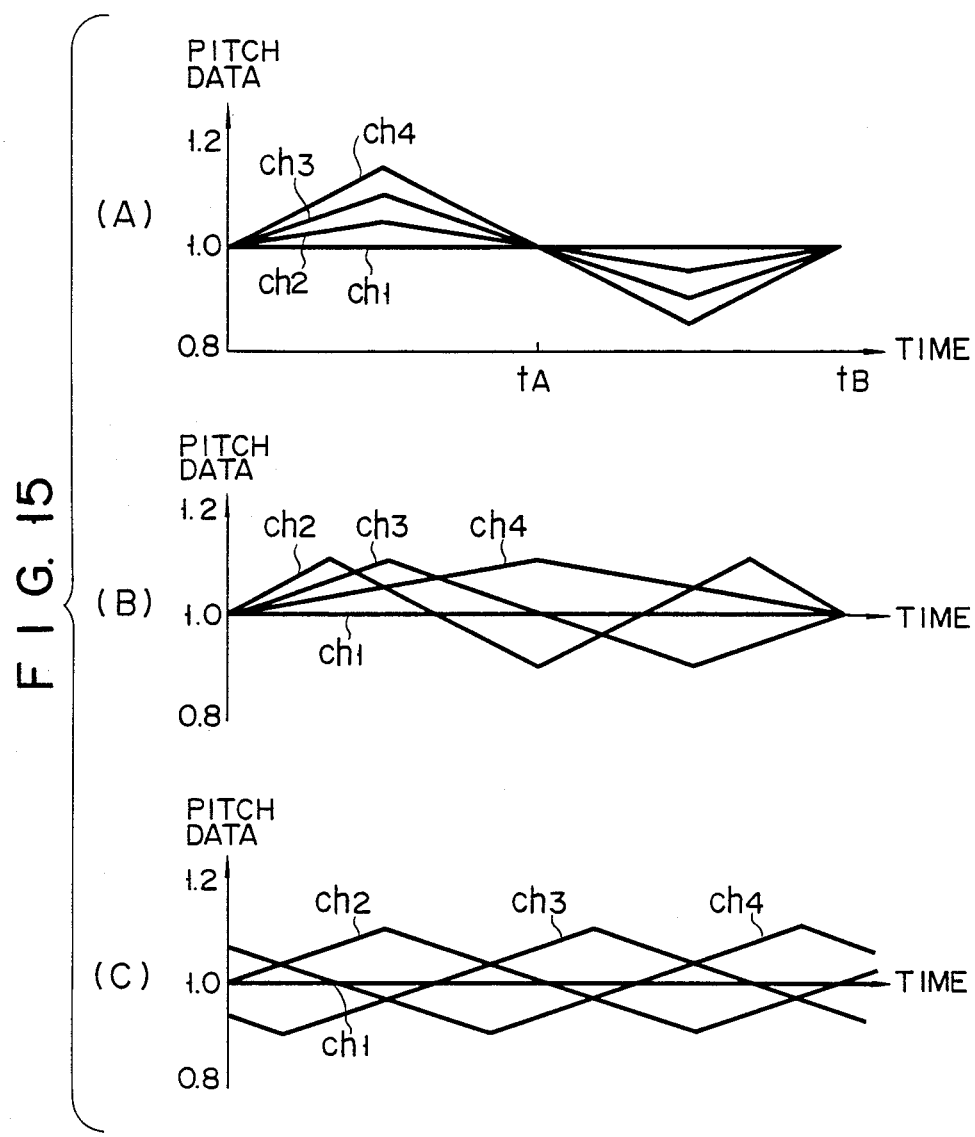

F I G. 17
| | PHASE | RATE | DEPTH |
|---|---|---|---|
| LFO1 | 0 | 0 | 0 |
| LFO2 | 120° | 50 | 35 |
| LFO3 | 240° | 50 | 35 |
| LFO4 | 360° | 50 | 35 |
F I G. 18
```
LFO  3            PHASE = 240°
RATE = 50         DEPTH = 35
```
CURSOR   LCD
F I G. 19
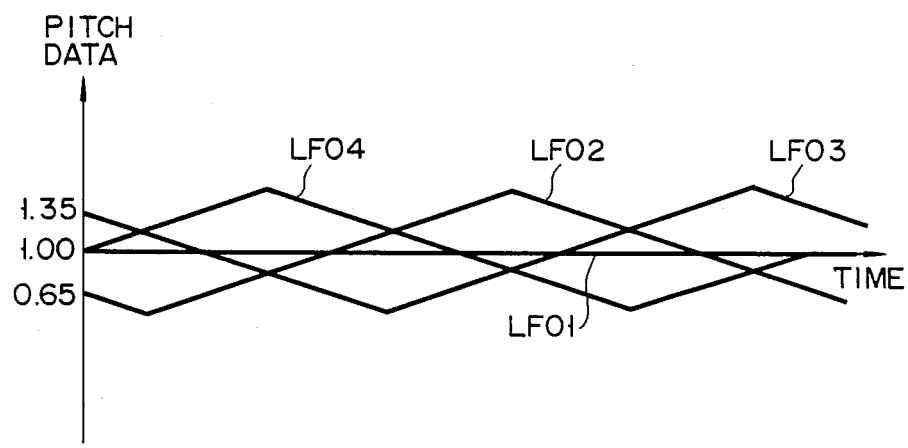

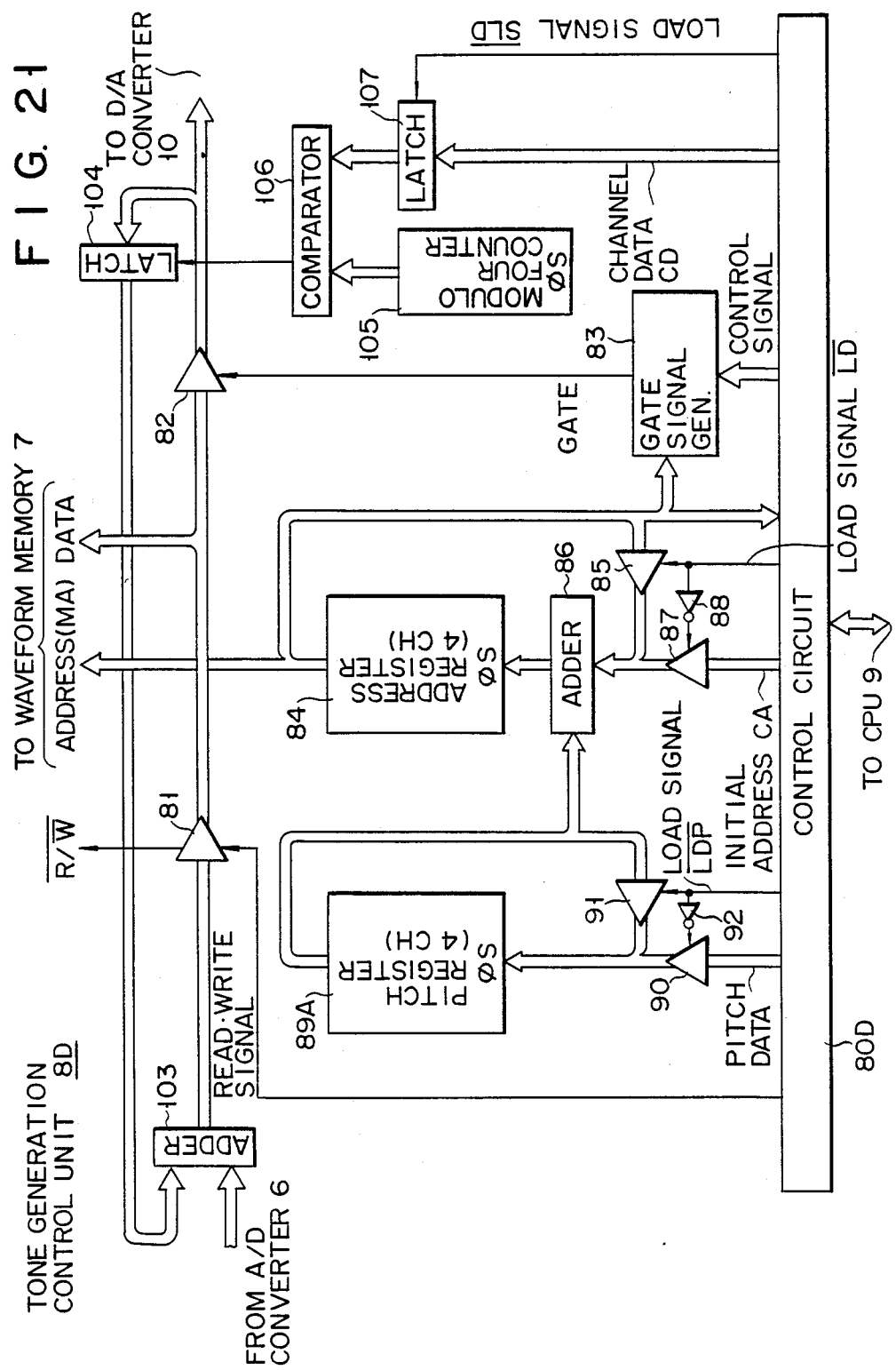

EFFECTOR FOR ELECTRONIC MUSICAL INSTRUMENT

BACKGROUND OF THE INVENTION

This invention relates to an effector for an electronic musical instrument with at least an essential part thereof constituted by a digital circuit.

Heretofore, there have been developed various effectors which provide various effects to musical tones to produce tones which are considerably different from the original tones. Many of these effectors use such elements as BBD, so that their signal-to-noise ratio is inferior. Recently, there have been developed systems in which a waveform signal is written in a digital memory or so-called digital delay unit to be read out after a delay time. In this case, however, the output signal is monotonous and unsatisfactory.

SUMMARY OF THE INVENTION

An object of the invention is to provide an effector for an electronic musical instrument which permits provision of a variety of effects to the input original tone.

According to the invention, there is provided an effector comprising analog-to-digital conversion means for converting an input waveform signal into a digital signal, and waveform memory means for storing the digital signal provided from the analog-to-digital conversion means thereby providing a predetermined effect on an acoustic signal produced on the basis of the digital signal read out from the waveform memory, which effector further comprises control means having a plurality of waveform read/write channels for effecting the reading and writing of the digital signal with respect to the waveform memory means, read control means for causing the digital signal from the analog-to-digital conversion means to be written in the waveform memory means through one of the waveform read/write channels of the control means and causing the written digital signal to be read out from the waveform memory means through at least two other waveform read/write channels of the control means, and sounding means for converting the digital signals read out through the aforesaid at least two waveform read/write channels into analog signals to be sounded.

BRIEF DESCRIPTION OF THE DRAWINGS

FIG. 1 is a block diagram showing the entire circuit construction of a first embodiment of the invention;

FIG. 9 is a view for explaining the setting of delay times;

FIG. 10 is a view for explaining a different example of setting of delay times;

Figure 13:
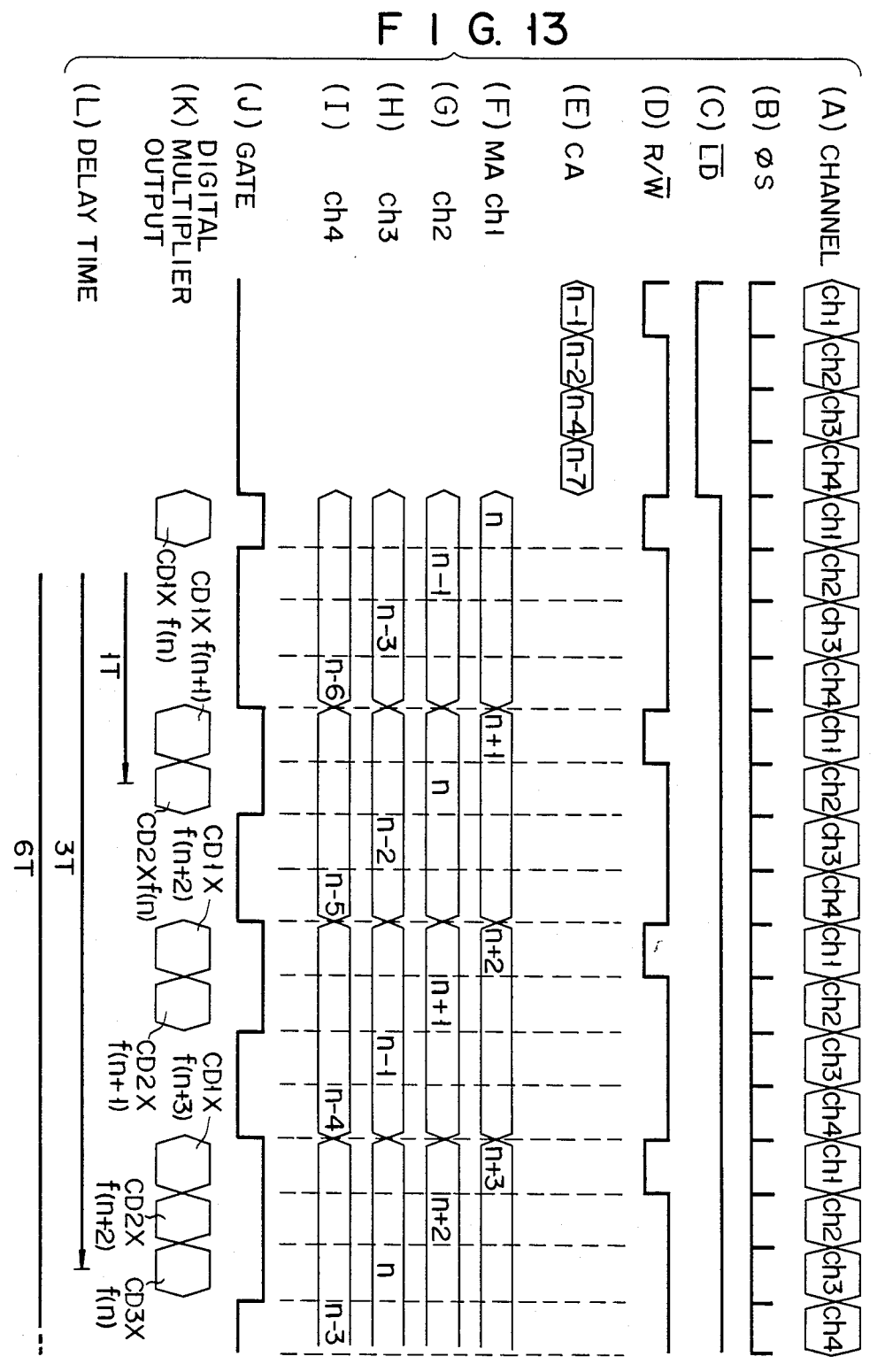

FIG. 13 is a timing chart for explaining the operation of the third embodiment;

FIG. 15 is a view for explaining operation for providing frequency modulation;

FIG. 17 is a view showing different frequency modulation conditions;

FIG. 18 is a view showing a display on a display panel;

FIG. 19 is a view for explaining operation when providing four different frequency modulations;

FIG. 21 is a block diagram showing the detailed circuit construction of a tone generation control unit of the fifth embodiment.

DETAILED DESCRIPTION OF THE PREFERRED EMBODIMENTS

Figure 1A:
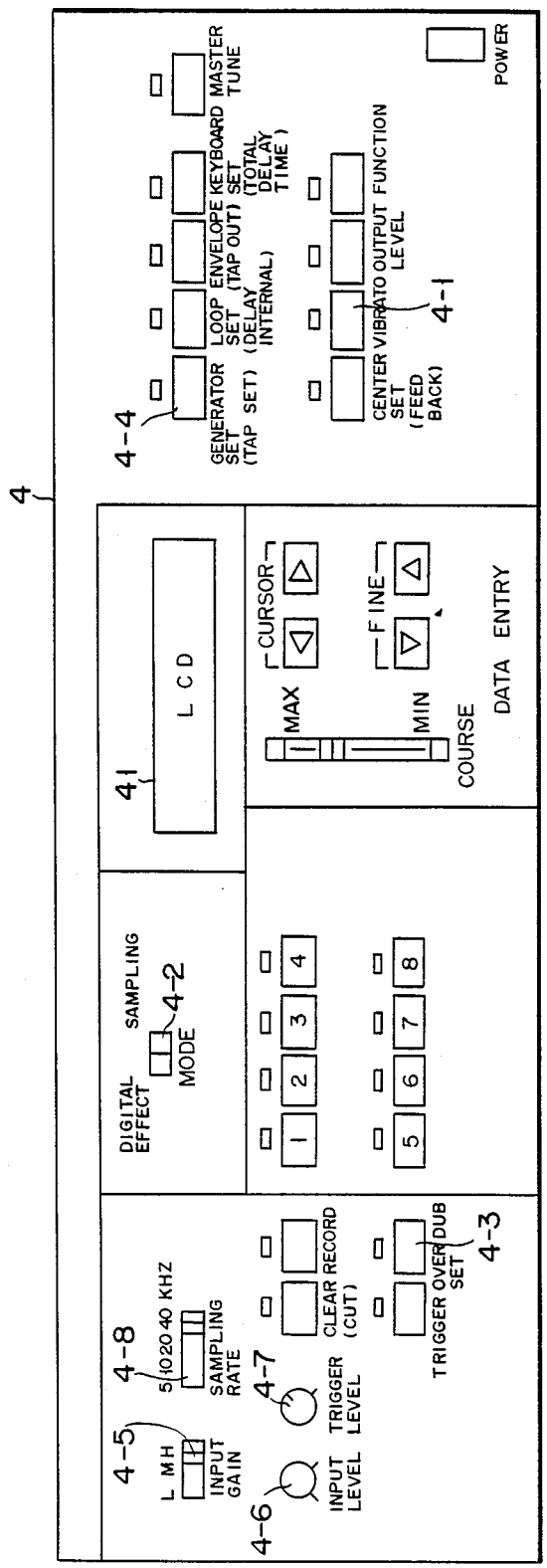
FIG. 1A is a plan view showing an example of keyboard/display shown in FIG. 1.

Now, the invention will be described in conjunction with some preferred embodiments illustrated in the drawings.

(First Embodiment)

A first embodiment will be described with reference to FIGS. 1 to 6. In this embodiment, an effector for an electronic musical instrument is constructed using an electronic musical instrument, which has a so-called sampling function to permit conversion of an externally supplied acoustic signal into a digital signal, i.e., modulation of the signal by PCM (pulse code modulation) for instance, and which stores the digital signal thus obtained in a semiconductor memory such as a RAM for using the stored signal as a sound signal for a keyboard musical instrument.

FIG. 1 shows the circuit construction of the embodiment. Input signal IN which is supplied through a microphone or the like, is amplified by input amplifier 1 and then fed to analog adder 2. The output of analog adder 2 is fed to sample/hold (S/H) circuit 5 to be sampled at a suitable sampling frequency. The rate of sampling is determined by switch 4-8. The output of S/H circuit 5 is fed to analog-to-digital (A/D) converter 6. A/D converter 6 converts the input analog signal into a corresponding digital signal which is fed to tone generation control unit 8.

The tone generation control unit 8 has four waveform read/write channels, for instance. These waveform read/write channels can independently perform the writing and reading of waveform signals with respect to waveform memory 7. Tone generation control unit 8 may have a detailed construction which is disclosed in the U.S. patent application Ser. No. 760,291 filed on July 29, 1985 (60P276-1, C371P8501). It will be described later in detail with reference to FIG. 3.

Tone generation control unit 8 is operated under control of CPU 9 consisting of a microcomputer or the like. Tone generation control unit 8 reads out digital signals corresponding to at most four tones from waveform memory 7 on a time-division basis via the four waveform read/write channels and feeds the readout digital signals on a time-division basis to digital-to-analog (D/A) converter 10. The analog signal output of D/A converter 10 is fed to S/H circuits 11a to 11d.

S/H circuits 11a to 11d perform a sampling operation during respective time-division basis processing channel periods under control of timing signals t1 to t4 generated from clock generator CL.

S/H circuits 11a to 11d feed their respective hold voltage signals to voltage controlled filters (VCFs) 12a to 12d, respectively. VCFs 12a to 12d perform independent filtering operation according to respective voltage signals FCV1 to FCV4.

VCFs 12a to 12d feed filtered analog waveform signals to voltage controlled amplifiers (VCAs) 13a to 13d.

VCAs 13a to 13d have their gain controlled independently according to control voltage signals ACV1 to ACV4 fed to them to determine the output level or tone volume envelope with respect to their waveform signal outputs.

The output signals of VCAs 13a to 13d are fed as respective channel outputs OUT1 to OUT4 to be suitably amplified and sounded.

The outputs of VCAs 13a to 13d are also mixed in analog adder 14, the output of which is supplied as mixed output OUT MIX.

The output of VCF 12d, corresponding to the fourth channel and the output of analog adder 14, is fed to analog switch 15, which is switched under control of CPU 9.

Analog switch 15 thus selectively passes the output of VCF 12d and output of analog adder 14 to VCA 16.

VCA 16 amplifies the input according to control voltage signal ACV0, and its output is fed back to analog adder 2.

Thus, an external signal which is supplied to input amplifier 1 and a waveform signal read out from waveform memory 7 can be mixed in analog adder 2 and then stored again in waveform memory 7.

Reference numeral 4 in the Figure designates a keyboard having keys corresponding to respective musical notes, various control switches as shown in FIG. 1A, and a liquid crystal display panel 41 or the like for various state displays. The keyboard and display are coupled to CPU 9 for data transmission.

CPU 9 performs software processing to feed digital signals to D/A converter group 17 for conversion to voltage signals which serve as control signals FCV1 to FCV4, ACV1 to ACV 4 and ACV0 noted above (these signals being generally referred to as control signal CV).

D/A converter group 17 may consist of a plurality of D/A converters corresponding in number to the number of control signals CV. Alternately, a single D/A converter may be used on a time division basis in combination with sample/hold circuits to obtain necessary control signals CV.

Reference numeral 18 in FIG. 1 designates modulation setting memory which can store modulation designation data. Modulation setting memory 18 exchanges data with control circuit 80 in tone generation control unit 8. Its data is set under control of CPU 9 in response to the operation of VIBRATO switch 4-1 shown in FIG. 1A and operation of keyboard/display 4.

The circuit construction of tone generation control unit 8 will now be described with reference to FIG. 2.

The digital signal representing the waveform from A/D converter 6 is fed through gate 81 to be fed to waveform memory 7 and also through gate 82 to D/A converter 10.

Gate 81 is controlled by read/write signal R/$\overline{W}$ which is fed from control circuit 80 of tone generation control unit 8 in response to a control command form CPU 9.

Gate 81 is in an enabled or open state when a waveform signal is written in waveform memory 7. It is in a disabled or closed state when a waveform signal is read out from waveform memory 7. Actually, gate 81 is controlled by signal $\overline{R/W}$ which is obtained by inverting read/write signal R/W noted above.

To gate 82 is fed gate signal Gate which is provided from gate signal generator 83 according to a control signal from control circuit 80. Gate 82 is held in the enabled state when and only when providing the digital signal fed through gate 81 or providing digital signal read out from waveform memory 7, and it is held disabled in the other circumstances.

Figure 2:
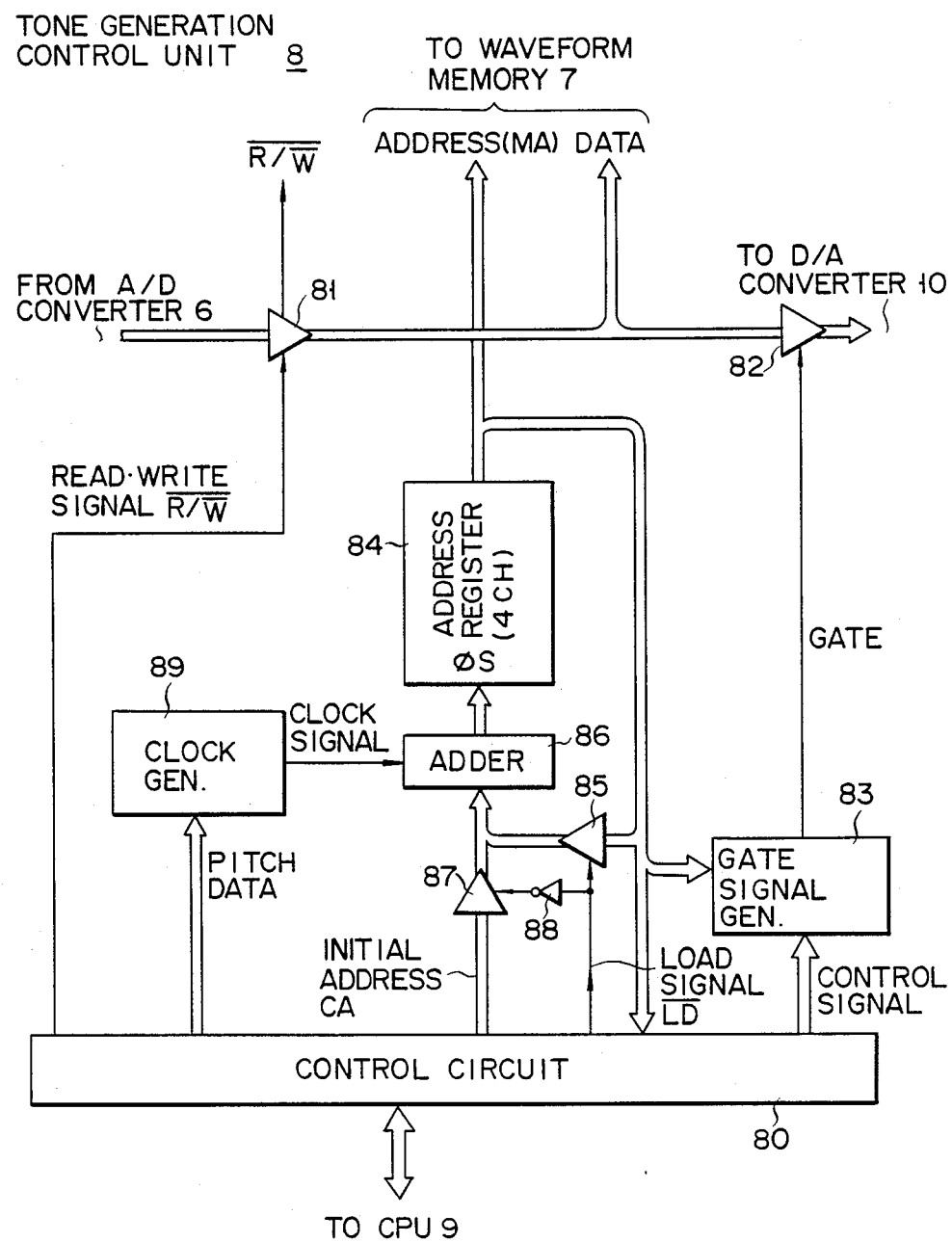
FIG. 2 is a block diagram showing the detailed circuit construction of a tone generation control unit of the first embodiment.

Reference numeral 84 in FIG. 2 designates the address shift register having four stages (for the four channels) and consisting of a predetermined number of bits. The shift operation of address register 84 is controlled by master clock 3, to be described later, which is provided from clock generator CL. Address register 84 operates on a time division basis as a 4-channel address register. Data in its last stage is fed as address data to waveform memory 7. When and only when read/write signal R/$\overline{W}$ is at a low level, the waveform signal fed through gate 81 is written in a pertinent memory address. When read/write signal R/$\overline{W}$ is at a high level, digital signal is read out from the pertinent memory address.

Data from address register 84 is fed to gate 85 and also to gate signal generator 83 and control circuit 80.

The address signal passed through gate 85 is fed to adder 86, which performs an addition or subtraction operation for address updating. The output of adder 86 is fed back to address register 84.

Initial address CA is fed from control circuit 80 through gate 87 to adder 86.

More specifically, load signal $\overline{LD}$ is fed directly to gate 85, while it is fed through inverter 88 to gate 87. When load signal $\overline{LD}$ is at a low level, initial address CA from control circuit 80 is fed through gate 87 to adder 86. When load signal is at a high level, on the other hand, gate 85 is enabled, and data in the last stage of address register 84 is fed to adder 86.

Clock signal KC is fed from clock generator 89 to adder 86. When digital signal is read out from waveform memory 7 in accordance with a tone pitch frequency, a clock signal is fed to the adder at a rate corresponding to pitch data from control circuit 80.

Figure 4:
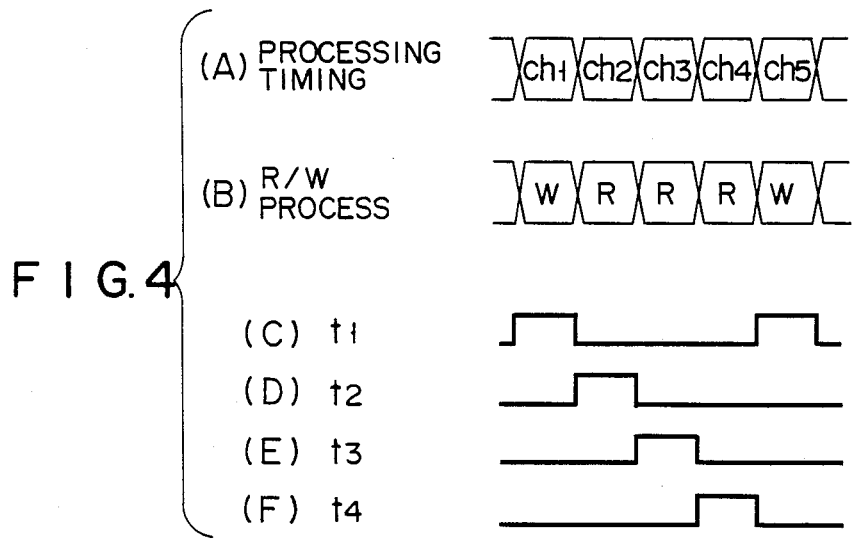
FIG. 4 is a timing chart illustrating a basic operation.

The operation of the embodiment will now be described. FIG. 4 shows the relation between the time division multiplexing of the individual channels of tone generation control unit 8 and timing signals t1 to t4 fed to S/H circuits 11a to 11d. As noted above, in this embodiment the four waveform read/write channels are realized by a time division multiplexing arrangement, and either read operation or write operation is selectively designated independently for each waveform read/write channel. In an example shown in (B) in FIG. 4, in the case of channel 1 (ch1), a waveform signal obtained through filter 3, S/H circuit 5 and A/D converter 6 is written in waveform memory 7, while in the cases of the other channels 2 to 4 (ch2 to ch4), a digital waveform signal is read out from a predetermined area of waveform memory 7.

Timing signals t1 to t4 shown in (C) to (F) in FIG. 4 assume a high level during periods corresponding to the respective channels (ch1 to ch4). During their high level period the analog waveform signal provided from D/A converter 10 is sampled and held in S/H circuits 11a to 11d.

Figure 3:
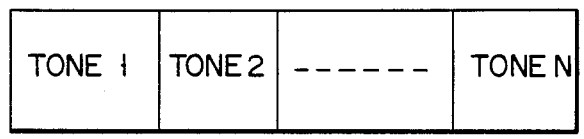
FIG. 3 is a view showing divisions of a waveform memory.

Each waveform read/write channel of tone generation control unit 8 can independently designate a read/write memory area. For example, in the cases of channels 2 to 4, tone data 1 to 3 shown in FIG. 3 are read out to be fed through VCFs 12b to 12d, VCAs 13b to 13d, analog adder 14, switch 15 and VCA 16 to analog adder 2 and thence mixed with an external sound signal, by operating overdubbing mode switch 4-3 shown in FIG. 1A, if necessary. The output signal of adder 2 is subjected to processing of the channel to be stored as tone data N in waveform memory 7 again. It is to be noted that it is possible to effect overdubbing.

Further, it is possible that CPU 9 switches analog switch 15 to let a waveform signal be read out, in the processing of channel 4, from waveform memory 7 to be fed through S/H circuit 11d, VCF 12d and VCA 16 to analog adder 2 for mixing with an external sound signal before being written in a predetermined area of waveform memory 7 in the manner as described above.

Now, the operation of the embodiment used as an effector will be described with reference to FIGS. 5 and 6.

Figure 6:
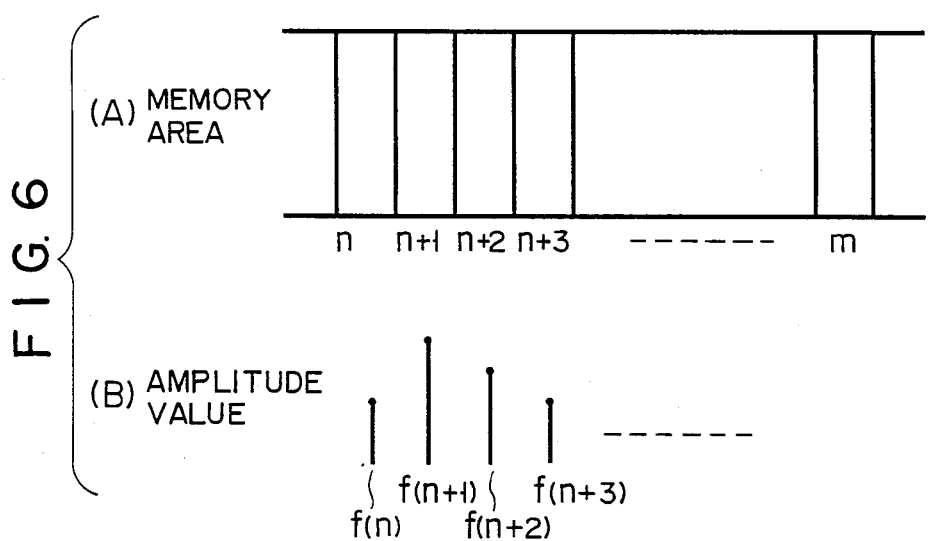
FIG. 6 is a view showing data stored in the waveform memory.

FIG. 6 shows the memory areas of waveform memory which are used for the operation. These memory areas are of addresses n to m and are set by generator set switch 4-4. Control circuit 80 of tone generation control circuit 8 feeds as initial address CA data n for channel 1 (ch1), data n−1 for channel 2 (ch2), data n−3 for channel 3 (ch3) and data n−6 for channel 4 (ch4) to address register 84, shown in FIG. 2.

Figure 5:
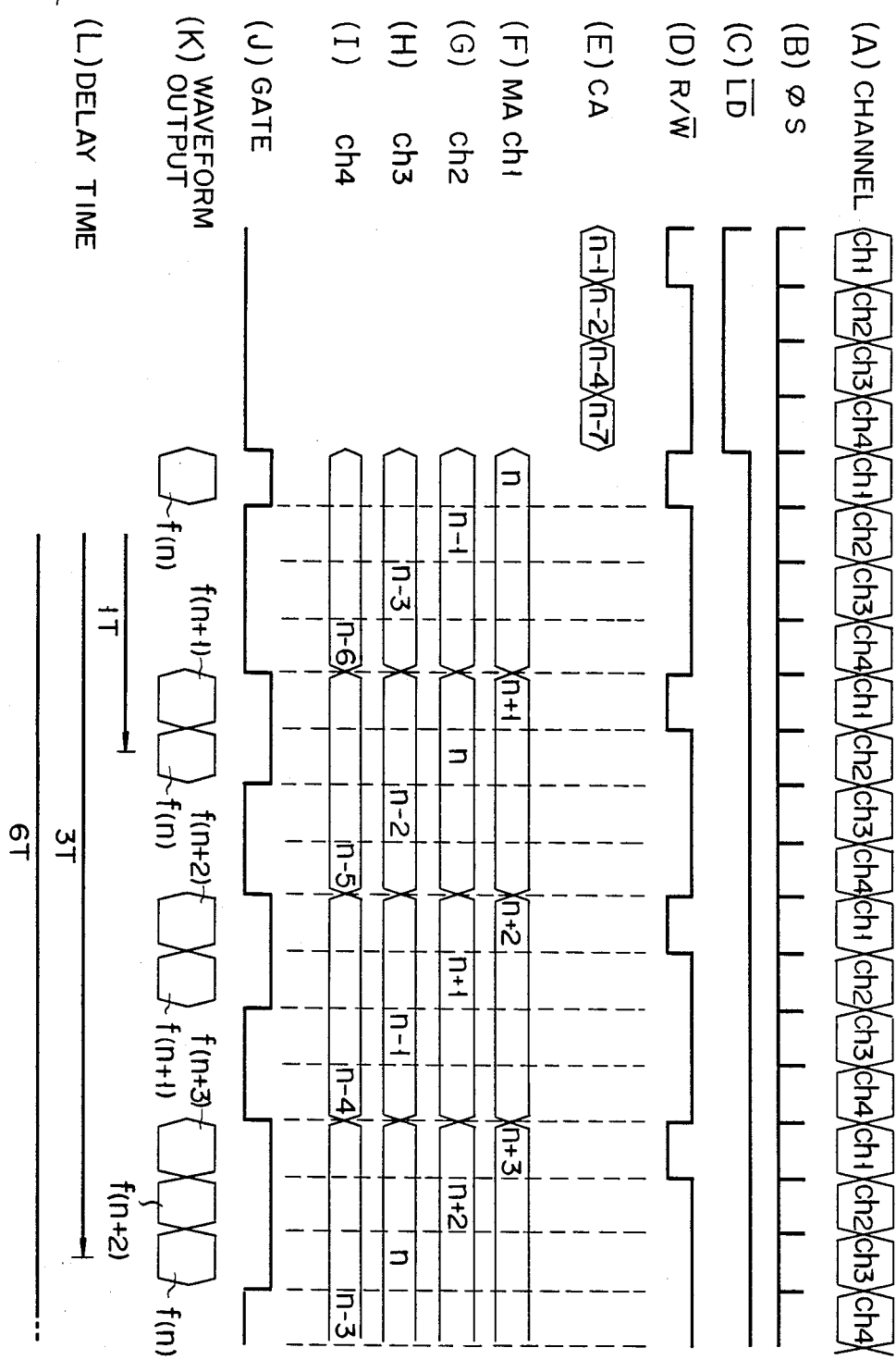
FIG. 5 is a timing chart for explaining a detailed operation.

More specifically, load signal $\overline{LD}$ is held at a low level, as shown at (C) in FIG. 5, during one cycle consisting of channels 1 to 4 as shown in (A) in FIG. 5. During this period, data n−1, n−2, n−4 and n−7 are fed as initial address CA for respective channels 1 to 4, as shown in (E) in FIG. 5. These data are incremented by +1 in adder 86 to set the values noted above as address data.

Read/write signal $R/\overline{W}$, as shown in (D) in FIG. 5, is set to low level for progressively writing digital signal from A/D converter 6 in waveform memory 6, i.e., writing process, for channel 1, while it is set to high level for reading out from waveform memory 7 the digital data immediately previously written therein, i.e., read process, for other channels 2 to 4.

Further, gate signal generator 83 generates gate signal Gate for holding gate 82 enabled for channel 1, as shown in (J) in FIG. 5. For other channels 2 to 4, gate 82 is enabled when and only when designating address n and following addresses, as shown in (A) in FIG. 6.

As a result, amplitude values f(n), f(n+1), f(n+2), ... are written in respective addresses of waveform memory 7 through the operation of channel as shown in (B) in FIG. 6. These data are fed through gate 82 to D/A converter 10 and thence through S/H circuit 11a, VCF 12a and VCA 13a for conversion into an acoustic signal to be sounded.

In channel 2, the digital signal that has been written in waveform memory 7 through the operation of channel 1, is read out from waveform memory 7 by using a delay time of 1T corresponding to four channels (T=4 by channel time) as shown in (K) and (L) in FIG. 5. For channel 3, the same digital signal is read out with a delay time of 3T, and for channel 4 it is read out with a delay time of 6T. One channel time is defined by a master clock from clock generator CL.

In other words, in channels 2 to 4 the digital signals corresponding to the amplitude values shown in (B) in FIG. 6 are fed to D/A converter 10 with delay times corresponding to difference values set as initial address CA.

It is to be noted that it is possible that the waveform signals of channels 2 to 4 are provided through VCFs 12b to 12d and VCAs 13b to 13d for timbre and tone volume controls separate from those effected on the waveform signal of channel 1 before these signals are sounded.

In the above way, channel 1 writes the waveform signal supplied through A/D converter 6 in waveform memory 7, and channels 2 to 4 read out the written signal from waveform memory 7 with respective delay times of 1T, 3T and 6T, whereby four tones are simultaneously generated. When the address data reaches address m of waveform memory 7 as shown in (A) in FIG. 6, initial address is fed again as data n−1. Now, channel 1 writes a new waveform signal in address n of waveform memory 7, and channels 2 to 4 read out this new waveform signal. In this way, tone data can be provided continuously for a long musical performance.

While the above description was concerned with a case of causing operation of all the four channels to simultaneously generate four tones, it is also possible to cause selective operation of a smaller number of channels to produce the original tone and one or more delayed tones.

Further, while in the above case times 1T, 3T and 6T have been set as delay time for channels 2 to 4 with respect to channel 1, it is possible to set the delay time for each channel from keyboard/display 4.

As has been shown, in the above embodiment a plurality of waveform read/write channels are used to write a waveform signal in waveform memory 7 and read it out with predetermined delay times for combination with the original tone waveform signal. Thus, it is possible to realize a variety of delay effects.

Further, in the above embodiment the timbre and tone volume controls are done independently for the individual waveform read/write channels through VCFs 12a to 12d and VCAs 13a to 13d. Thus, it is possible to obtain a further effected sound.

Further, while in the above embodiment VCFs 12a to 12d and VCAs 13a to 13d have been used for the timbre and tone volume controls, it is also possible to use digital filters or digital multipliers for the control of the timbre, tone volume, envelope, etc.

Further, other processes may be performed on the waveform signal.

Further, in the above embodiment the tone generation control unit 8 has been provided with a plurality of waveform read/write channels as a time division multiplexing arrangement. However, it is also possible to provide a plurality of waveform read/write channels by using separate hardware or like circuit construction for each channel.

Further, only particular channels among a plurality of channels may be made exclusive write channels for only writing waveform signal in waveform memory 7, while the other channels are made exclusive read channels for only reading out waveform signal from waveform memory 7. The "waveform read/write channel" according to the invention means a channel which is capable of both read and write operations or only either read or write operation.

Further, while the above embodiment of the invention was concerned with an electronic musical instrument having a sampling function, the invention may be realized as an effector having an exclusive circuit construction as well.

As has been shown in the above embodiment, according to the invention it is possible to realize an effector for an electronic musical instrument, which has a simple and inexpensive circuit construction and is capable of simultaneously producing a plurality of sounds on the basis of an input tone which is desired musically, and thus allows a great variety of forms of performance.

(Second Embodiment)

A second embodiment will now be described with reference to FIGS. 7 to 11.

In this embodiment, an input waveform signal is converted into a digital signal and then written in a waveform memory, and the written digital signal is read out through a plurality of waveform read/write channels with respective delay times designated in correspondence to a maximum or minimum delay time to be converted to an analog signal and sounded.

Figure 7:
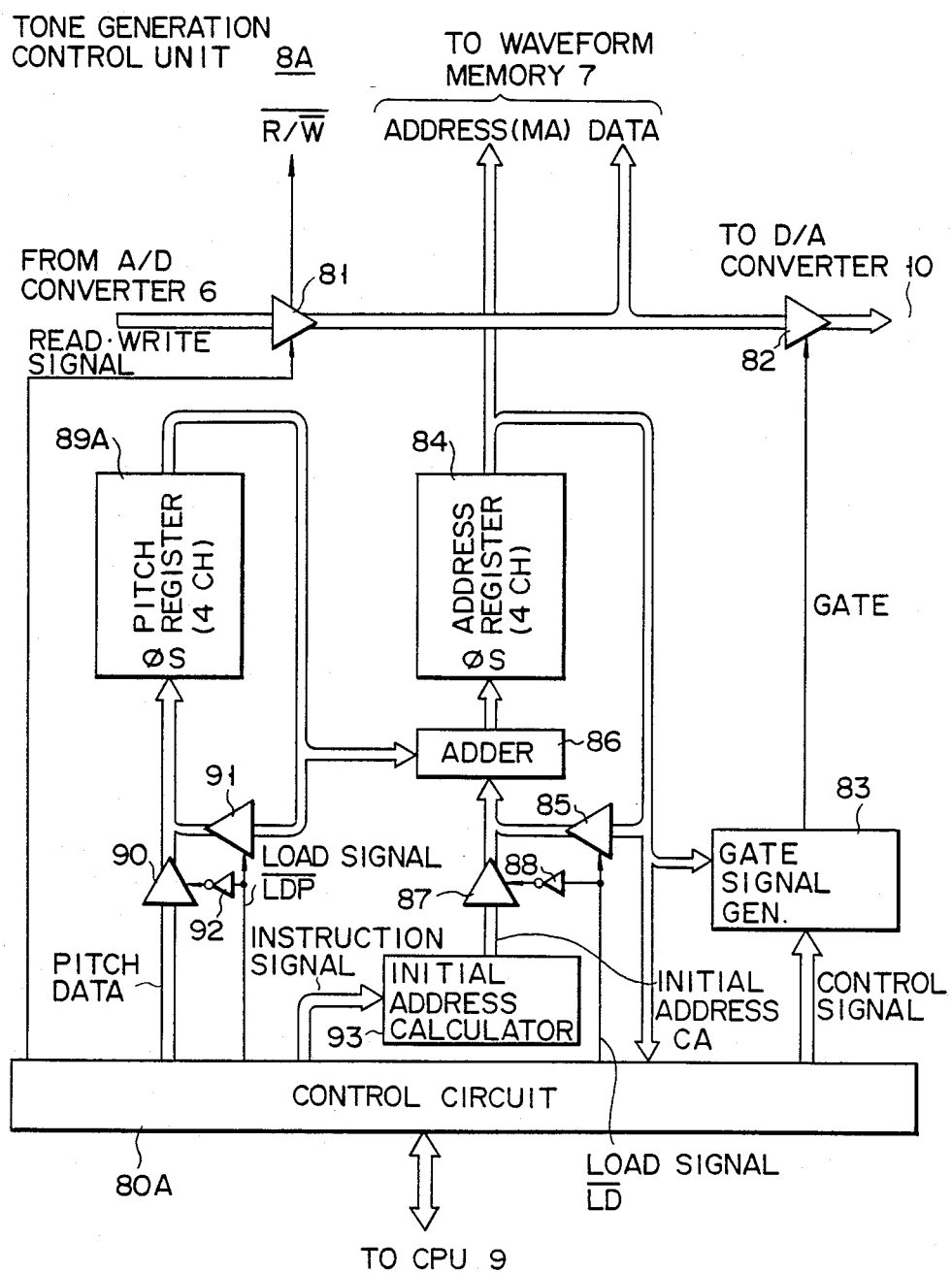
FIG. 7 is a block diagram showing the detailed circuit construction of a tone generation control unit of a second embodiment of the invention.

FIG. 7 shows a circuit corresponding to tone generation control unit 8 of FIG. 2 in the first embodiment. Parts like those are designated by like reference numerals, and their description is omitted. The overall construction of the second embodiment is the same as that shown in FIG. 1.

In this embodiment, tone generation control unit 8A includes pitch register 89A, which, like address register 84, consists of a shift register having a 4-stage structure, and it performs shift operation under control of master clock $\phi s$. Pitch data for designating a rate corresponding to the speed of writing and reading with respect to waveform memory 7, is fed from control circuit 80A through gate 90 to pitch register 89A. The value of this data is held through gate 91, and it is fed to adder 86.

More specifically, when writing pitch data from control circuit 80A through gate 90 in pitch register 89A, load signal $\overline{LDP}$ is rendered to be at low level, and it is fed through inverter 92 to gate 90 to enable gate 90.

Normally, load signal $\overline{LDP}$ is fed at high level to gate 91 to enable gate 91.

The pitch data and address data stored in address register 84 include decimal fraction data which are used for address designation of waveform memory 7. When the pitch data is just "1", data in address register 84 is incremented by +1 every time the pertinent channel data is fed to adder 86. If the data is above 1, the address updating speed is increased, while it is reduced if the data is below 1. In normal performance, pitch data corresponding to note pitch is fed to pitch register 89A.

Further, by varying the pitch data in pitch register 89A with time, it is possible to vary the speed of address data updating with time and obtain for instance, a tone signal with a vibrato effect provided through frequency modulation.

Initial address CA is fed to adder 86 from initial address calculator 93 through gate 87. Initial address calculator 93 calculates initial address CA on the basis of the content specified from CPU 9 according to an input operation of keyboard/display 4. This initial address defines the delay time for each channel, as will be described later.

The operation of the embodiment will now be described. The time chart of FIG. 8 corresponds to the time chart of FIG. 5. In this embodiment, data n, n−1, n−2 and n−4 are fed as initial address data CA as shown in (F) to (I) in FIG. 8 for respective channels 1 to 4 (ch1 to ch4). The same memory areas n to m as in the first embodiment, as shown in (A) in FIG. 6 are used.

Figure 8:
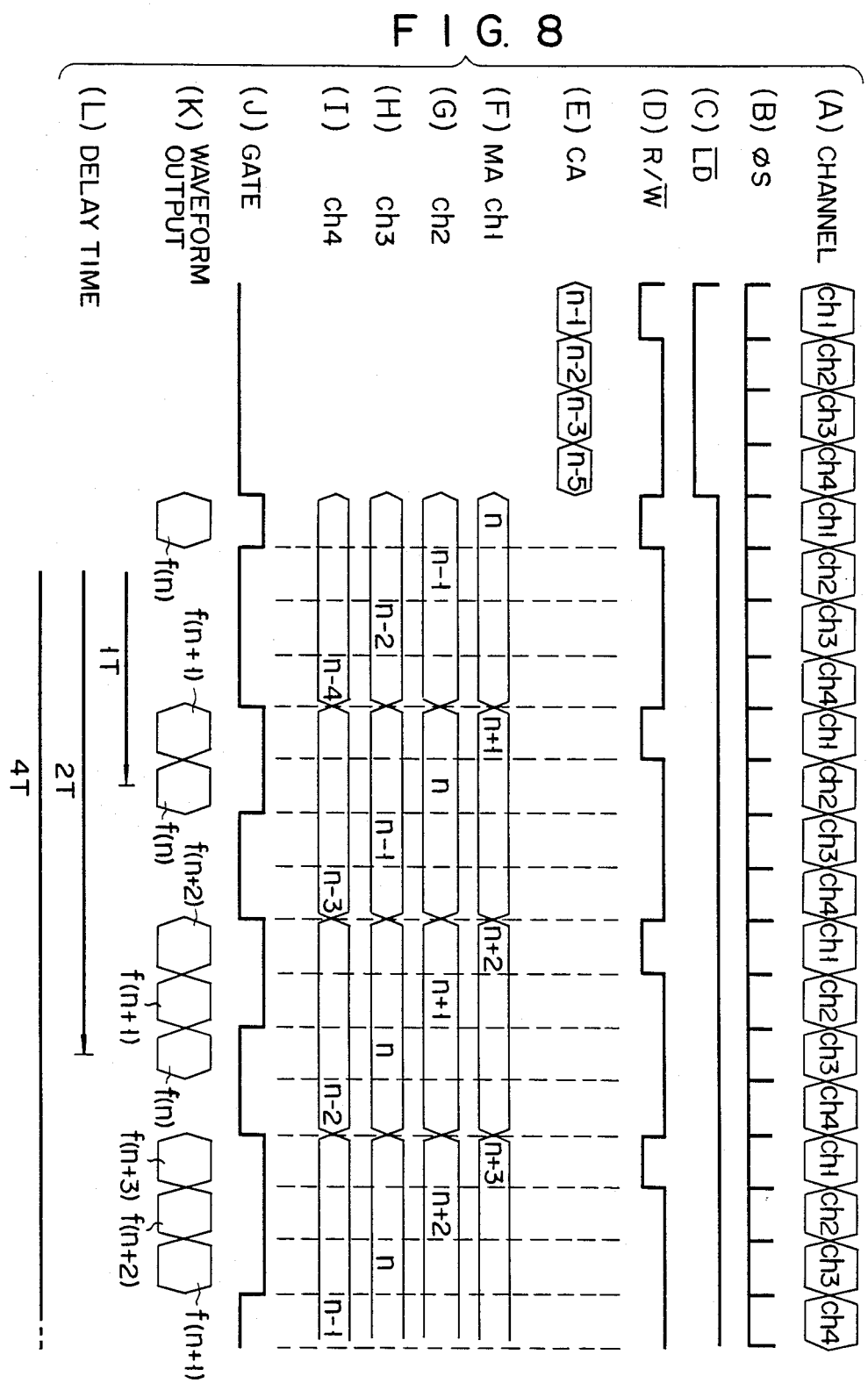
FIG. 8 is a timing chart for explaining the operation of the second embodiment.

More specifically, load signal $\overline{LD}$ is held at low level during one cycle consisting of channels 1 to 4 as shown in (A) in FIG. 8. During this period, data n−1, n−2, n−3 and n−5 are fed as initial address CA for respective channels 1 to 4. These data are incremented by +1 in adder 86 to set the values noted above as address data.

Read/write signal R/$\overline{W}$, as shown in (D) in FIG. 8, is set to low level for progressively writing digital signal from A/D converter 6 in waveform memory 6, while it is set to high level for reading out from waveform memory 7 the digital data immediately previously written for other channels 2 to 4.

Further, gate signal generator 83 generates gate signal Gate for holding gate 82 enabled for channel 1, as shown in (J) in FIG. 8. For other channels 2 to 4, gate 82 is enabled when and only when designating address n and following addresses.

As a result, amplitude values f(n), f(n+1), f(n+2), . . . are written in respective addresses of waveform memory 7 through the operation of channel 1. These data are fed through gate 82 to D/A converter 10 and thence through S/H circuit 11a, VCF 12a and VCA 13a for conversion into an acoustic signal to be sounded.

In channel 2, the digital signal that has been written in waveform memory 7 through the operation of channel 1, is read out from waveform memory 7 by using a delay time of 1T corresponding to four channels (T=4 channel time). For channel 3, the same digital signal is read out with a delay time of 2T, and for channel 4 it is read out with a delay time of 4T.

In other words, in channels 2 to 4 the digital signals corresponding to the amplitude values are fed to D/A converter 10 with delay times corresponding to difference values set as initial address CA.

It is to be noted that it is possible that the waveform signals of channels 2 to 4 can be provided through VCFs 12b to 12d and VCAs 13b to 13d for timbre and tone volume controls separate from those effected on the waveform signal of channel 1 before these signals are sounded.

In the above way, channel 1 writes the waveform signal supplied through the A/D converter 6 in waveform memory 7, and channels 2 to 4 read out the waveform signal from waveform memory 7 with respective delay times of 1T, 2T and 4T, whereby four tones are simultaneously generated. When the address data reaches address m of waveform memory 7 as shown in FIG. 6, the initial address is fed again as data n−1. Now, channel 1 writes a new waveform signal in address n of waveform memory 7, and channels 2 to 4 read out this new waveform signal. In this way, tone data can be provided continuously for a long musical performance.

In the above example, data n−2, n−3 and n−5 as initial address data CA are calculated by initial address calculator 93 and set in address register 84 for the reading of the waveform signal from waveform memory 7 through channels 2 to 4 with delay times of 1T (25%), 2T (50%) and 4T (100%) from the timing of writing the input waveform signal through channel 1. Initial address calculator 93 obtains initial address CA defining the delay times as follows, as shown in FIG. 9.

A case is considered, in which the maximum delay time is designated from keyboard/display 4 with the delay time ratios of 25%, 50% and 100% set for respective channels 2 to 4.

Assuming that the unit speed of address updating corresponds to 1 msec., initial address calculator 93 calculates the initial address as start address using an equation $$CA_j = n - MDT \times \frac{TP_j}{100}$$

where j represents the channel number, $CA_j$ represents the initial address of channel j, n represents the first address of used memory area of waveform memory 7, MDT represents the preset maximum delay time, and $TP_j$ represents the delay point for channel j in %, which takes a value less than 100.

When initial address CA is set using the above equation as shown in FIG. 9, the maximum delay time is 10 msec. This is shown in (A) in FIG. 11.

Figure 11:
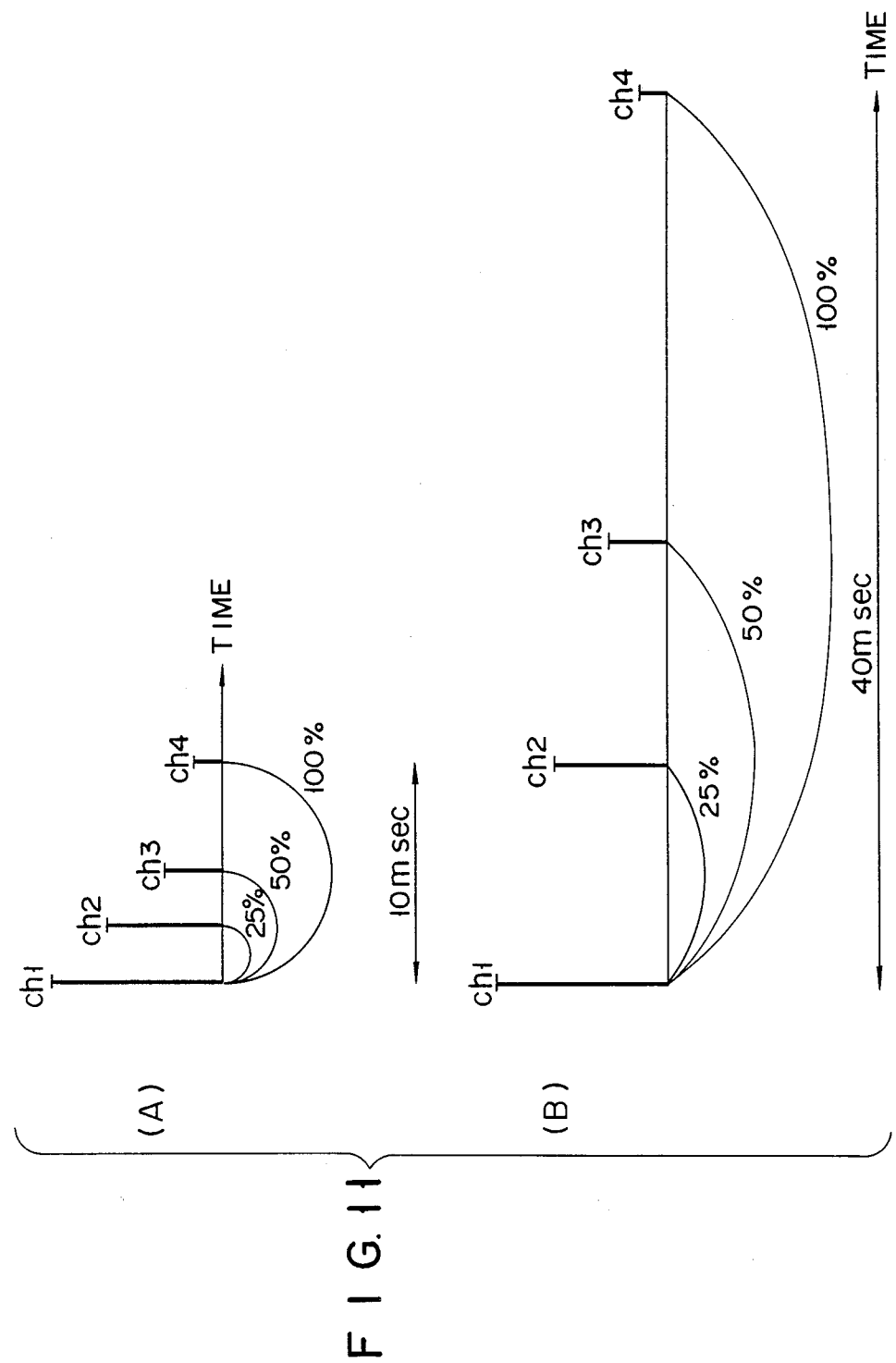
FIG. 11 is a view for explaining the relation between delay time and output signal.

When initial address CA is set as shown in FIG. 10, the maximum delay time is 40 msec. as shown in (B) in FIG. 11.

A value obtained after incrementation of the initial address value by +1 in adder 86 is stored in address register 84, initial address calculator 93 providing a value obtained by subtraction of 1 from the value shown in FIGS. 9 or 10.

As has been shown, in this embodiment the delay time for each channel is calculated according to the designated maximum delay time while maintaining the delay time ratio for each channel, and the corresponding initial address is obtained from initial address calculator 93 and preset in address register 84. Thus, it is possible to readily realize delay time of a constant ratio with a simple input procedure.

While the above description has concerned with a case of causing operation of all the four channels to simultaneously generate four tones, it is also possible to cause selective operation of a smaller number of channels to produce the original tone and one or more delayed tones.

In the above embodiment, the maximum delay time is first determined, and then the delay time for each channel is set according to the maximum delay time. Conversely it is possible to set the delay time for each channel after the setting of the minimum delay time.

For example, with an address updating unit speed of 1 msec. initial address CA for each channel can be calculated using an equation $$CA_j = n - LDT \times \frac{TP_j}{100}$$

where LDT represents the minimum delay time and $TP_j$ represents the ratio of other delay time to the minimum delay time (TP being greater than 100%).

For example, in the case of FIG. 11, $TP_2=100$, $TP_3=200$ and $TP_4=400$. Thus, the same results can be obtained when LDT is set to 2.5 (in case of (A) in FIG. 11) and when it is set to 10 (in case of (B) in FIG. 11). Of course, when the unit speed of the memory address updating is changed, the same results can be obtained by correspondingly slightly altering the equation for the calculation.

Further, while in the above embodiment the delay time for each channel is determined by setting initial address corresponding to the delay time in address register 84 for determining the address of waveform memory 7, it is also possible to control gate signal generator 83 so as to start the address updating and enable gate 82 after the lapse of a delay time as counted by a counter for each channel.

Further, various modifications and applications of the circuit construction are possible as in the first embodiment.

As has been shown in the above embodiment, according to the invention it is possible to realize an effector for an electronic musical instrument, which has a simple and inexpensive circuit construction. In addition, when generating a plurality of tones on the basis of an input tone, the delay times, with which the data is read out from waveform memory means through a plurality of waveform read/write channels, are determined in accordance with a preset maximum or minimum delay time, which is desired musically and thus allows a great variety of forms of performance with simple input operation.

(Third Embodiment)

A third embodiment will now be described with reference to FIGS. 12 and 13.

In this embodiment, an input waveform signal is converted into a digital signal and then written in a waveform memory. The written digital signal is read out through a plurality of waveform read/write channels, and each read-out digital data is independently multiplied by multiplication data in a digital multiplier, thereby determining the tone volume level or tone volume envelope of the output tone.

The overall circuit construction of this embodiment is substantially the same as that of the first embodiment shown in FIG. 1, so it is not described. Digital multiplier 90, to be described later, can serve the role of VCAs 13a to 13d, so that it is possible to omit VCAs 13a to 13d. FIG. 12 shows tone generation control unit 8B. Tone generation control unit 8B has substantially the same construction as that shown in Fi. 2, so like parts are designated by like reference numerals and are not described any further.

Figure 12:
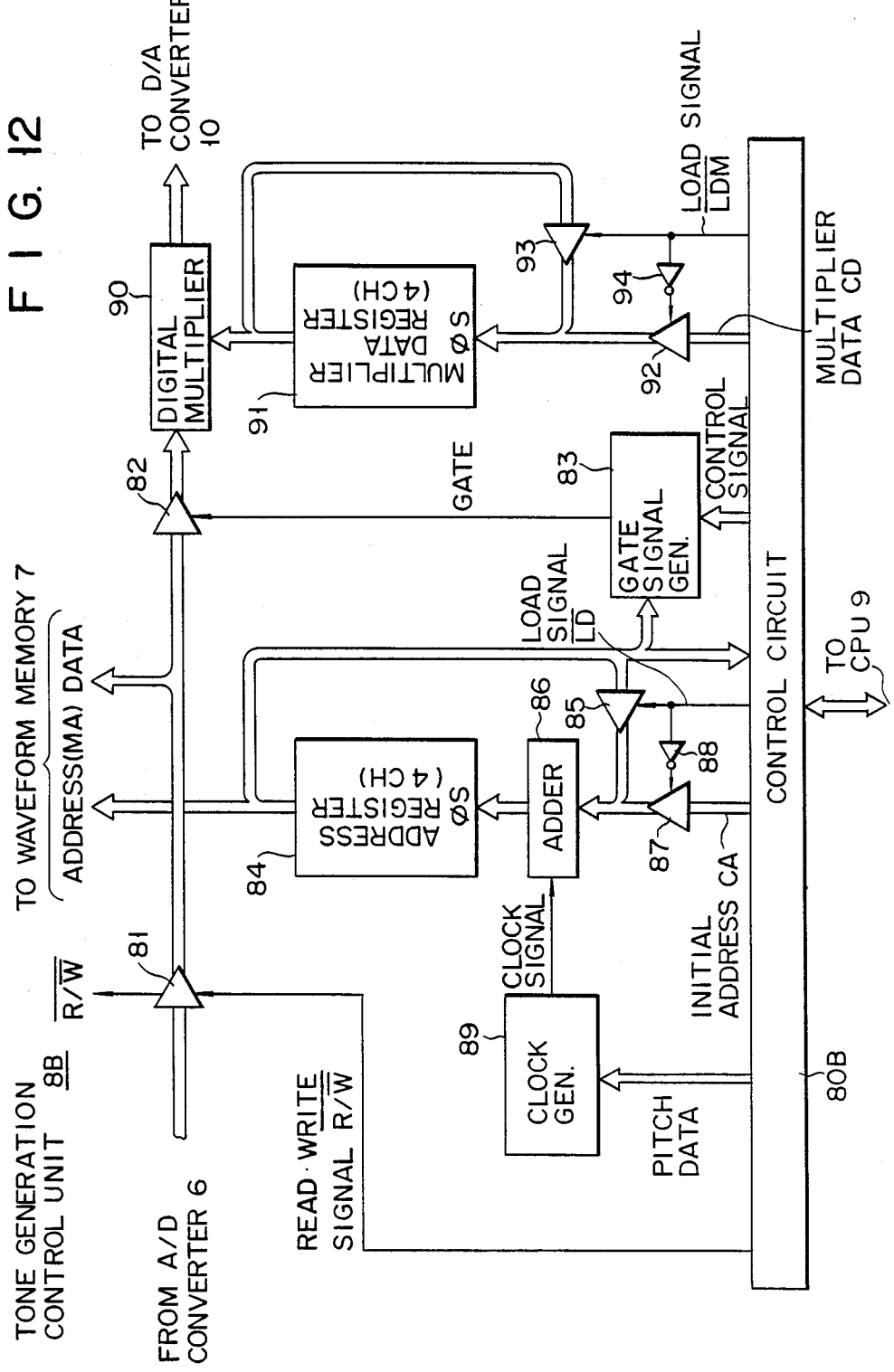
FIG. 12 is a block diagram showing the detailed circuit construction of a tone generation control unit of a third embodiment of the invention.

Reference numeral 91 in FIG. 12 designates a multiplication data register which feeds multiplication-data to digital multiplier 90. Like address register 84, multiplication data register 90 consists of a four-stage shift register. The shift operation of each stage is effected under control of master clock $\phi$s. The multiplication data is fed as data CD from control circuit 80B through gate 92 to multiplication data register 91. The output data of multiplication data register 91 is fed back through gate 93 thereto, whereby the data is held.

Load signal $\overline{LDM}$ is fed through inverter 94 to gate 92, while it is directly fed to gate 93.

Multiplication data CD1 to CD4, the values of which can be determined independently of one another, can be stored for respective channels in multiplication data register 91. Digital multiplier 90 can multiply waveform data fed through gate 82 by multiplication data for each channel, whereby the tone volume of output tone corresponding to each channel can be digitally controlled. Further, it is possible to provide a tone volume envelope independently for each of the channels by varying multiplication data CD1 to CD4 with time. Multiplication data can be determined with the operation of the keyboard/display by the performer.

The operation of the embodiment will now be described with reference to FIG. 13. The operation is substantially the same as described before in connection with FIG. 5. In this embodiment, however, load signal $\overline{LDM}$ is fed at low level for the feeding of multiplication data CD1~CD4 from control circuit 80B through gate 92 to multiplication register 91. After this feeding operation, data in multiplication register 91 is fed back through gate 93, and is provided to digital multiplier 90 each channel time.

As a result, amplitude values f(n), f(n+1), f(n+2), ... are written in respective addresses of waveform memory 7 through the operation of channel 1. As shown in (K) in FIG. 13, these data are fed through gate 82 to D/A converter 10 and thence through S/H circuit 11a, VCF 12a and VCA 13a for conversion into an acoustic signal to be sounded.

In channel 2, the digital signal that has been written in waveform memory 7 through the operation of channel 1 is read out from waveform memory 7 by using a delay time of 1T corresponding to four channels (T=4 by channel time) as shown in (K) and (L) in FIG. 5. For channel 3, the same digital signal is read out with a delay time of 3T, and for channel 4 it is read out with a delay time of 6T.

In other words, in channels 2 to 4 the digital signals corresponding to the amplitude values multiplied by respective multiplication on data CD2 to CD4 are fed to D/A converter 10 with delay times corresponding to the differences between initially set addresses (CA).

It is to be noted that it is possible that the waveform signals of channels 2 to 4 be provided through VCFs 12b to 12d for timbre control separate from that effected on waveform signal of channel 1 as original tone and also tone volume control through the processing of digital multiplier 90 before these signals are sounded.

In the above way, channel 1 writes the waveform signal supplied through the A/D converter 6 in waveform memory 7, and channels 2 to 4 read out the written signal from waveform memory 7 with respective delay times of 1T, 3T and 6T, whereby four tones are simultaneously generated. When the address data reaches the last address m of memory area of waveform memory 7, the initial address is fed again as data n−1. Now, channel 1 writes a new waveform signal in address n of waveform memory 7, and channels 2 to 4 read out this new waveform signal. In this way, tone data can be provided continuously for a long musical performance.

While the above description was concerned with a case of causing operation of all the four channels to simultaneously generate four tones, it is also possible to cause selective operation of a smaller number of channels to produce the original tone and one or more delayed tones.

Further, while in the above case times 1T, 3T and 6T have been set as delay time for channels 2 to 4 with respect to channel 1, it is possible to set the delay time for each channel from keyboard/display 4.

Further, by causing multiplication data stored in multiplication data register 91 to be varied with the lapse of time, it is possible to provide a tone volume envelope to the output tone from each channel.

As has been shown, in the above embodiment a plurality of waveform read/write channels are used to write a waveform signal in waveform memory 7 and read it out with predetermined delay times for combination with the original tone waveform signal. Thus, it is possible to realize a variety of delay effects. Further, it is possible to effect tone volume control of the tone provided from each channel through digital multiplication processing of digital multiplier 90.

Further, various modifications and applications of the circuit construction are possible as in the previous embodiments.

As has been shown in the above embodiment, according to the invention it is possible to realize an effector for an electronic musical instrument, which has a simple and inexpensive construction and permits ready tone volume or tone volume envelope control when simultaneously generating a plurality of tones on the basis of an input tone, which is desired musically and allows a great variety of forms of performance with simple input operation.

(Fourth Embodiment)

A fourth embodiment of the invention will now be described with reference to FIGS. 14 to 19.

In this embodiment, an input waveform signal is converted into a digital signal and then written at a predetermined speed in a waveform memory. The written digital signal is read out through a plurality of waveform read/write channels in a frequency-modulated state at a speed different from the predetermined speed for conversion into an analog signal to be sounded.

Further, in this embodiment the condition of such a modulation is indicated to the performer.

Figure 14:
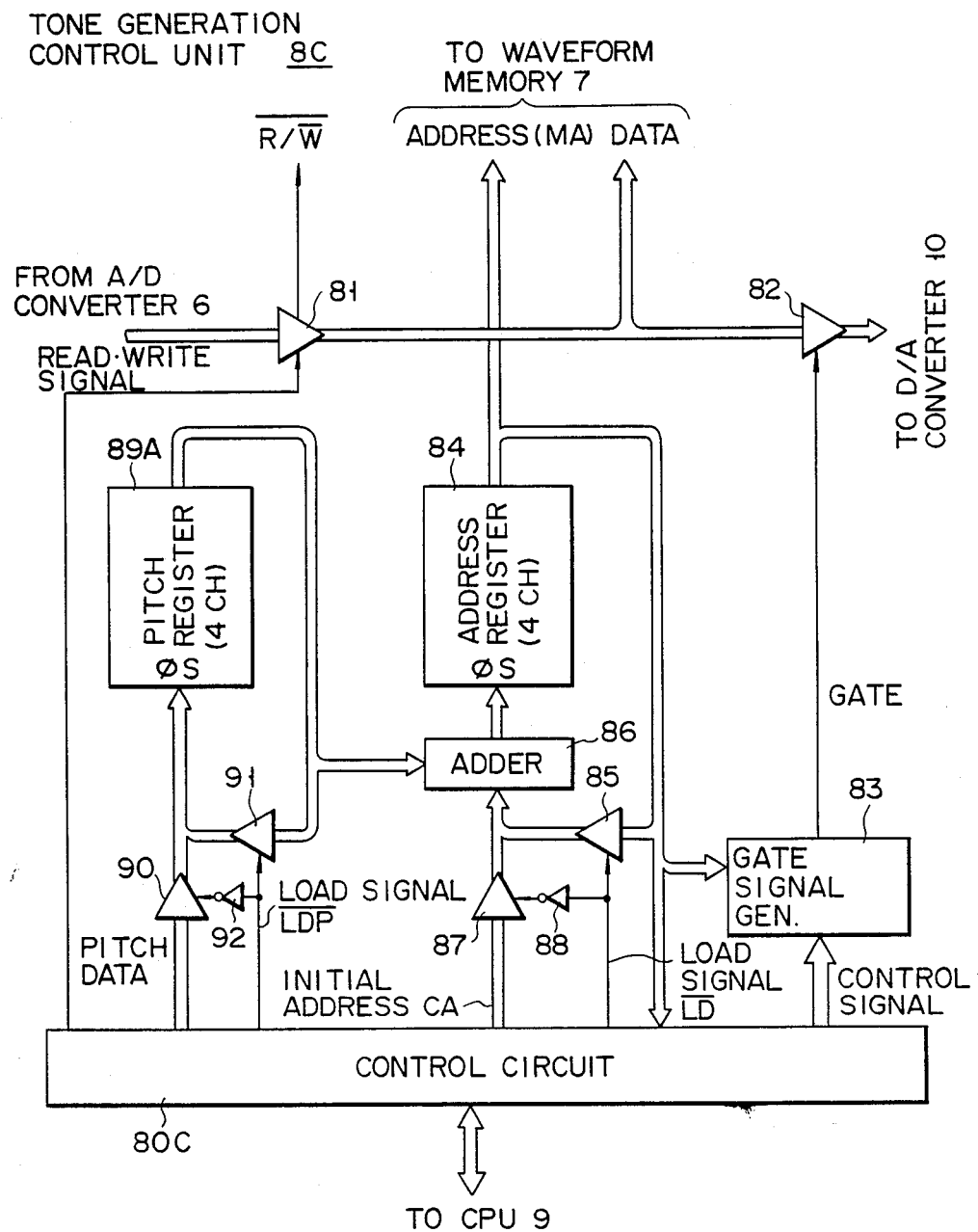
FIG. 14 is a block diagram showing the detailed circuit construction of a tone generation control unit of a fourth embodiment of the invention.

The overall circuit construction of this embodiment is again substantially the same as of the first embodiment shown in FIG. 1, so that it is not described. FIG. 14 shows the construction of tone generation control unit 8C. Tone generation control unit 8C has substantially the same construction as that of the second embodiment shown in FIG. 7, so like parts are designated by like reference numerals and are not described any further.

In this embodiment, pitch data in pitch register 89A is re-written with time as shown in (A) in FIG. 15. In channel 1 (ch1), however, a predetermined value, e.g., "1", is written and is held as such subsequently. More specifically, in channel 1 digital signal obtained from A/D converter 6 is written in each address sequentially, while in other channels 2 to 4 the updating speed is varied with time to read waveform data written in channel 1 from waveform memory 1 in a frequency modulated state.

Shown at (A) in FIG. 15 is an example, in which different depths of vibrato are provided for channels 2 to 4. In all of channels 2 to 4, one half cycle is $t_A$ and one cycle is $t_B$ as illustrated.

Further, it is possible to set different pitch data variation speeds for channels 2 to 4, as shown in (B) in FIG. 15. In this case, however, the vibrato depth is the same for channels 2 to 4.

Further, it is possible to make the pitch data variation speed and vibrato depth constant and provide different phases for channels 2 to 4. In this example, the phase is shifted at an interval of 120°.

Like the previous embodiment, it is arranged such that channel 1 writes a waveform signal through converter 6 in waveform memory 7, and channels 2 to 4 read out the written waveform signal from waveform memory 7 with respective delay times of 1T, 3T and 6T, thereby four tones are simultaneously generated. When the address data reaches the last address m of waveform memory 7, the initial address is fed again as data n−1. Now, channel 1 writes a new waveform signal in address n of waveform memory 7, and channels 2 to 4 read out this new waveform signal. In this way, tone data can be provided continuously for a long musical performance.

Now, an operation will be described in connection with a case of providing vibrato to all output tones by re-writing pitch data in pitch register 89A against time.

First, the vibrato phase, rate and depth for each channel is set by operating keyboard/display 4.

Figure 16A:
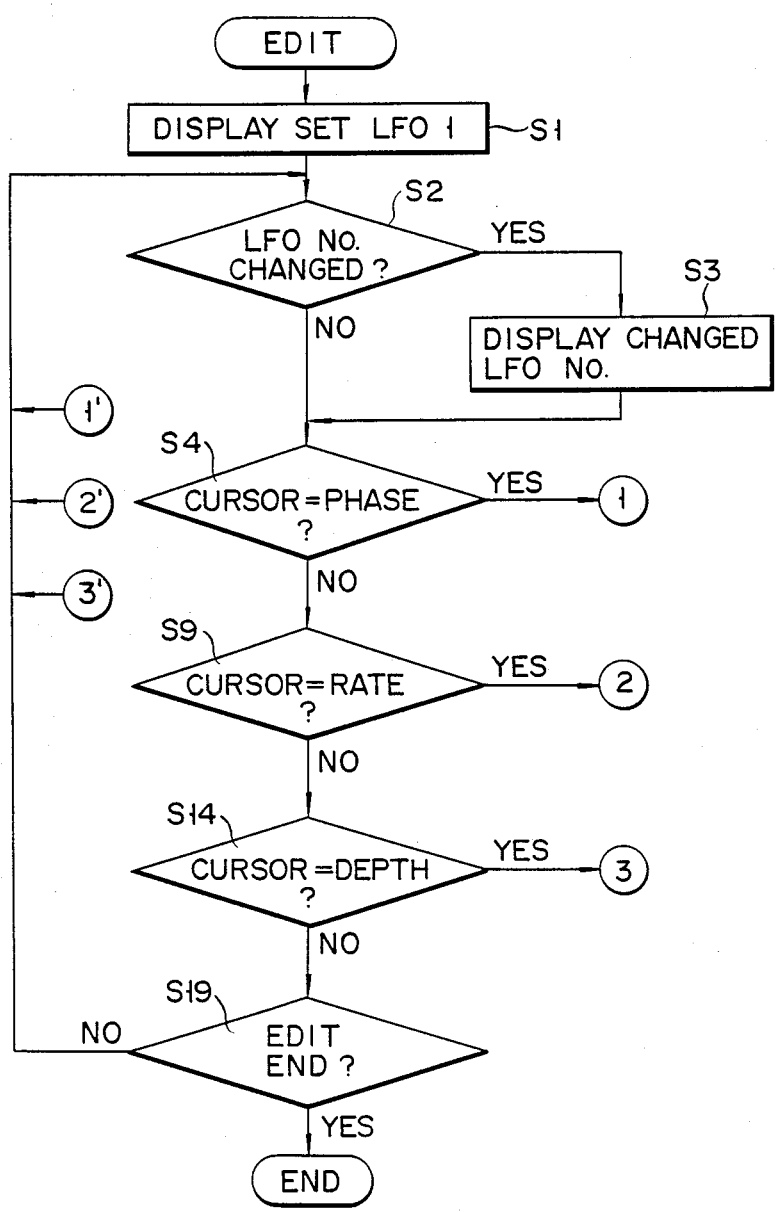
FIGS. 16A and 16B show, in combination, a flow chart for explaining input display operation.
Figure 16B:
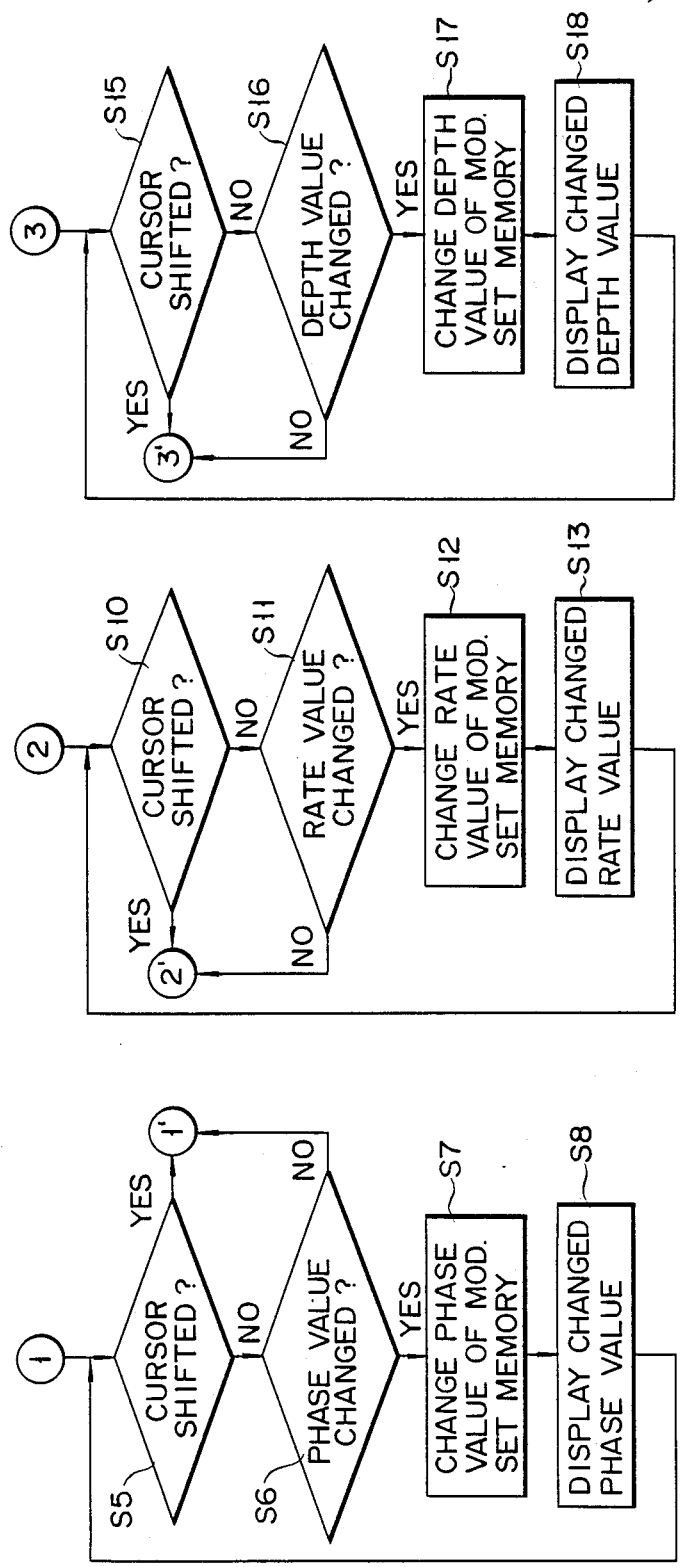

Each data is set according to the flow chart shown in FIG. 16. First, an edit mode of CPU 9 is set by operating a predetermined switch. Then, in step S1 the content of modulation LFO1 for channel 1 is displayed on liquid crystal display panel 41. The form of display will be described later with reference to FIG. 18.

In subsequent step S2 a check is done as to whether the condition of modulation for each channel is to be altered. If alteration of the LFO number is designated from the keyboard, the routine goes to step S3, and the content of the designated modulation LFO is displayed on liquid crystal display panel 41.

The routine then goes to step S4. If a decision "NO" is yielded in step S2, the routine goes to step S4.

In step S4 a check is done as to whether a cursor on liquid crystal display panel 41 is at PHASE position as shown in FIG. 18. If the check yields a decision "YES", the routine goes to step S5. In step S5 a check is done as to whether the cursor has moved from the PHASE position. If the decision is "YES", the routine goes back to step S2.

If it is decided in step S5 that the cursor has not been moved, the routine goes to step S6 of a check as to whether the phase value has been altered. If it is detected that the phase value has been altered by operation of numeral keys or up/down keys, the routine goes back to step S7. If a decision "NO" is yielded, the routine goes back to step S2.

In step S7, data in modulation setting memory 18 for the pertinent channel is altered under control of CPU 9. In step S8 the content is displayed on liquid crystal display panel 41. Subsequent to step S8 the routine goes back to step S5 to repeat the process described above.

If the decision of check in step S4 is "NO", the routine goes to step S9. In step S9 a check is done as to whether the cursor on liquid crystal display panel 41 is at RATE position. If the decision is "YES", the routine goes to step S10.

In step S10, a check is done as to whether the cursor has moved from the RATE position. If the decision is "YES", the routine goes back to step S2. If the decision of check of step S10 is "NO", the routine goes to step S11 of a check as to whether the rate value has been altered. If the decision is "NO", the routine goes back to step S2. If the decision is "YES", indicating that some key has been operated, the routine goes to step S12, in which the corresponding rate value for the pertinent channel is written in modulation setting memory 18.

The routine then goes to step S13, in which the value is displayed on liquid crystal display panel 41. The routine then goes back to step S10 to repeat the operation described above.

If the decision of the check of step S9 is "NO", the routine goes to step S14 of a check as to whether the cursor on liquid crystal display panel 41 is at DEPTH position. If the decision of the check is "YES", the routine goes to step S15.

In step S15, a check is done as to whether the cursor has moved from the DEPTH position. If the decision is "YES", the routine goes back to step S2. If the decision of the check of step S15 is "NO", step S16 is executed, in which a check is done as to whether the depth data has been altered by key operation. If the decision is "NO", the routine goes back to step S2. If the decision is "YES", indicating that some key has been operated, the routine goes to step S17, in which the altered depth value is written in the pertinent area of modulation setting memory 18. In subsequent step S18 the value is displayed on liquid crystal display panel 41. The routine then goes back to step S15 to repeat the operation described above.

If the decision of the check in step S14 is "NO", the routine goes to step S19 of a check as to whether the processing in the edit mode has been ended. If it is decided that a predetermined key has been operated so that CPU 9 is to return from the edit mode processing to the main routine, step S19 yields a decision "YES". If no such key has been operated, step S19 yields a decision "NO", indicating that it is necessary to alter each parameter, and the routine goes back to step S2.

In the above way, the modulation conditions for each channel are successively fed and set in modulation setting memory 18 as shown in FIG. 17.

FIG. 18 shows parameters shown in FIG. 17 for channel 3. In this example, it is shown on liquid crystal display panel 41 that the phase is 240°, the rate is 50 and the depth is 35.

FIG. 19 graphically shows the modulation conditions for each channel shown in FIG. 17. For channel 1 pitch data LFO1 is held constant, that is, a predetermined value, i.e., "1", is written in pitch register 89A shown in FIG. 14 and is held subsequently. Thus, digital signal obtained from A/D converter 6 is written in each address sequentially. For other channels ch2 to ch4, pitch data is varied with time as shown in FIG. 19. Thus, the address updating rate is varied, and the waveform data written through channel 1 is read out in a frequency modulated state from waveform memory 7.

Thus, with the modulation conditions for each channel set as shown in FIG. 17, it is possible to make the pitch data variation rate and vibrato depth constant and vary the phase for channels 2 to 4. In the above example, the phase is shifted at an interval of 120°.

In this embodiment, the vibrato depth, rate and phase may be selectively altered as a form of control when pitch data is written in pitch register 89A under control of a command generated from CPU 9 in response to an operation of keyboard/display 4.

When writing a value greater than "1" for channels 2 to 4 in pitch register 89A, the address updating is done at a higher rate than when writing the original tone through channel 1. It is possible to prevent address designation of other channels beyond the prevailing address designation position of channel 1 by setting a long delay time or setting a maximum value of data written in pitch register 89A to be only slightly greater than "1".

While the above description was concerned with a case of causing operation of all the four channels to simultaneously generate four tones, it is possible to cause selective operation of a smaller number of channels to produce the original tone, delayed tones being provided with vibrato.

Further, while in the above case delay times of 1T, 3T and 6T have been set for channels 2 to 4, it is possible to set the delay time for each channel from keyboard-/display 4.

As has been shown, in the above embodiment a plurality of waveform read/write channels are used to write a waveform signal in waveform memory 7 and read it out with predetermined delay times and also in a state provided with a frequency modulation, e.g., a vibrato, for combination with the original tone waveform signal. Thus, it is possible to realize a variety of effects.

Further, in the above embodiment a modulation signal is generated according to preset modulation conditions, and a desired modulation is provided to the output tone for sounding. Further, display means is provided to display the preset phase of the modulation signal, so that it is possible to set the modulation conditions easily, and confirming them visually.

Further, various modifications and applications of the circuit construction are possible as in the previous embodiments.

(Fifth Embodiment)

A fifth embodiment of the invention will now be described with reference to FIGS. 20 and 21.

In this embodiment, while an input waveform signal is converted into a digital signal and then written in a waveform memory, a feedback loop is provided to read out the written digital signal so as to combine it with a digital signal obtained through conversion of an input waveform signal and write the resultant signal in the waveform memory again. The digital signal output from the waveform memory is converted into an analog signal to be sounded.

Figure 20:
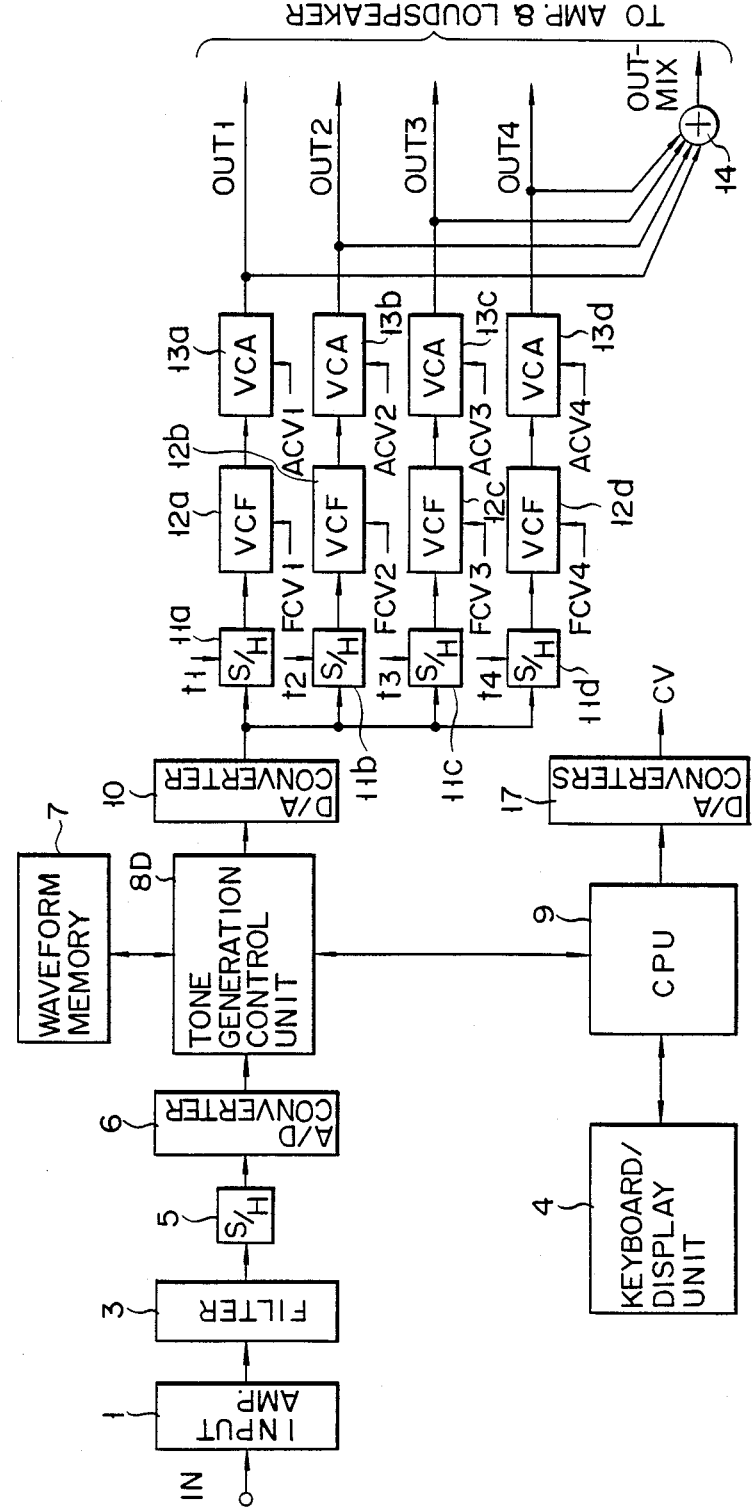
FIG. 20 is a block diagram showing the entire circuit construction of a fifth embodiment of the invention.

FIG. 20 shows the entire circuit, and FIG. 21 shows tone generation control unit 8D. Of the illustrated components those like those in the previous embodiments are designated by like reference numerals, and their description is omitted.

As shown in FIG. 20, in this embodiment tone generation control unit 8D is provided with an internal feedback loop. Thus, there is no need of feeding back the outputs of VCF 12d and VCAs 13a to 13d to the analog signal input side, and hence the corresponding circuit is omitted.

The detailed circuit construction of tone generation control unit 8D will now be described with reference to FIG. 21.

A digital signal from A/D converter 6 is fed through adder 103 to gate 81, and thence it is fed to gate 81 and also fed through gate 82 to D/A converter 10. The output of gate 82 is fed through latch 104 back to adder 103 through a feedback loop.

Reference numeral 105 in FIG. 21 designates modulo 4 counter for performing counting under control of master clock $\phi$s. It up-counts for each channel time of address register 84 and pitch register 89A, i.e., for each shift operation time of the shift register. Thus, the data of modulo 4 counter 105 designates a channel. The output of modulo 4 counter 105 is fed to comparator 106 for comparison with channel data CD stored in latch 107. When load signal $\overline{SLD}$ is at low level, channel data is fed from control circuit 80D to and latched in latch 107.

Comparator 106 provides a high level signal for a channel time corresponding to channel data latched in latch 107 to restrict the latch timing therein. Thus, of the digital signals read out from waveform memory 7 through each channel, only digital data of the designated channel is fed back to input side adder 103 to be digitally synthesized with a delayed feedback signal obtained from the original tone signal. The resultant signal is written again in waveform memory 7 and is also fed through gate 82 to D/A converter 10.

Now, the operation of this embodiment operated as an effector will be described.

Like the case of the previous embodiments, memory areas of addresses n to m of waveform memory 7 are assumed to be used memory areas. Thus, data n, n−1, n−3 and n−6 are fed as initial address for respective channels 1 to 4 (ch1 to ch4).

Channel 1 is used in write state, while channels 2 to 4 are used in read state.

As a result, amplitude values f(n), f(n+1), f(n+2), ... are written in respective addresses of waveform memory 7 through the operation of channel 1. These data are fed through gate 82 to D/A converter 10 and thence through S/H circuit 11a, VCF 12a and VCA 13a for conversion into an acoustic signal to be sounded.

In channel 2, the digital signal that has been written in waveform memory 7 through the operation of channel 1, is read out from waveform memory 7 with delay time of 1T corresponding to four channels (T=4 by channels time). For channel 3, the same digital signal is read out with delay time of 3T, and for channel 4 it is read out with delay time of 6T.

In other words, in channels 2 to 4 the digital signals corresponding to the amplitude values are fed to D/A converter 10 with delay times corresponding to difference values set as initial address CA.

It is to be noted that the waveform signals of channels 2 to 4 be provided through VCFs 12b to 12d and VCAs 13b to 13d for timbre and tone volume controls separate from those effected on the waveform signal of channel 1 before these signals are sounded.

In this way, channel 1 writes the waveform signal fed through A/D converter 6 in waveform memory 7, and channels 2 to 4 read out the written signal from waveform memory 7 with respective delay times of 1T, 3T and 6T, whereby four tones are simultaneously generated. When the address data reaches address m of waveform memory 7, the initial address is fed again as data n−1. Now, channel 1 writes a new waveform signal in address n of waveform memory 7, and channels 2 to 4 read out this new waveform signal. In this way, tone data can be provided continuously for a long musical performance.

Channel data CD for designating one of channels 2 to 4 is provided from control circuit 80D and preset in latch 107.

As a result, the digital signal of the designated channel is read out from waveform memory 7 in the designated channel time to be fed to latch 104 and thence to adder 103.

Thus, digital signal representing the original tone as fed through A/D converter 6 and digital signal read out with a predetermined delay time from waveform memory 7 are added together in adder 103, the output of which constitutes the digital output of channel 1 (ch1) and is fed to and stored in waveform memory 7 to be used for the reading through other channels (ch2 to ch4).

As has been shown, where the delay times of 1T, 3T and 6T are provided for respective channels 2 to 4 (ch2 to ch4), with channel data CD designating channel 2 fed to latch 107, the original tone and a digital signal obtained as a result of delaying the original tone by the time 2T are stored in waveform memory 7. Likewise, with channel data CD designating channel 3 fed to latch 107, the original tone and a digital signal obtained as a result of delaying the original tone by 3T are stored. Further, with channel data CD designating channel 4 fed to latch 107, the original tone and a digital signal obtained by delaying the original tone by 6T are stored.

While the above description was concerned with a case of causing operation of all the four channels to simultaneously generate four tones, it is also possible to cause selective operation of a smaller number of channels to produce the original tone and one or more delayed tones.

Further, while in the above case delay times of 1T, 3T and 6T have been set for channels 2 to 4 with respect to channel 1, it is possible to set the delay time for each channel from keyboard/display 4.

As has been shown, in the above embodiment a plurality of waveform read/write channels are used to write a waveform signal in waveform memory 7 and read it out with predetermined delay time, one of the delayed waveform signals being synthesized with the waveform signal of the original tone to store the resultant signal in waveform memory 7. Thus, it is possible to realize delay effects with a feedback loop.

Further, in the above embodiment the timbre and tone volume controls are done independently for the individual waveform read/write channels through VCFs 12a to 12d and VCAs 13a to 13d. Thus, it is possible to obtain a further effected sound.

In the above embodiment the original tone signal fed through gate 82 is latched without alteration of its amplitude level in latch 104 to be fed to adder 103. However, it is possible to provide a multiplier having a predetermined amplification factor or a level shifter between gate 82 and latch 104 to provide for a lower amplification factor for the tone obtained through the feedback than that for the original tone, whereby a reverberation effect can be obtained. Also, by providing substantially the same amplification factor for the tone obtained through the feedback as for the original tone, a round or trool effect can be obtained. Further, by altering the bit position of the output of gate 82 and input to latch 104, i.e., altering the writing of binary data, it is possible to realize a function equivalent to multiplication by 2 or ½.

Further, in the above embodiment one of the digital signals is read out from waveform memory 7 at least through two channels for digital synthesis with the original tone signal. However, it is also possible to feed back a plurality of digital signals of different delay times obtained through a corresponding number of channels for synthesis with the original tone signal.

Further, while in the above embodiment VCFs 12a to 12d and VCAs 13a to 13d have been used for the timbre and tone volume controls, it is possible to use digital filters or digital amplifiers for the control of the timbre, tone volume, envelope, etc.

Further, various modifications and applications of the circuit construction are possible as in the previous embodiments.

As has been shown, in the above embodiment it is possible to realize an effector with a feedback loop based on digital processing, so that it is possible to allow a great variety of musically desirous forms of performance.

While the first to fifth embodiments of the invention have been described above, various changes and modifications of these embodiments can be made without departing from the scope of the invention.

It is to be appreciated that according to the invention at least an essential part of an effector for an electronic musical instrument is realized by a digital circuit construction. Thus, it is possible to ensure improved reliability and stability compared to the prior art effector. In addition, it is possible to provide such modulation as delay or vibrato in a variety of forms. Further, it is possible to reduce the price of the effector.

What is claimed is:

1. An effector comprising
analog-to-digital conversing means for converting an input analog waveform signal into a digital signal;
waveform memory means for storing the digital signal provided from said analog-to-digital conversion means and providing a predetermined effect on an acoustic signal produced on the basis of the digital signal when read out from said waveform memory means;
control means having a plurality of waveform read/write channels for effecting the reading and writing of said digital signal with respect to said waveform memory means;
read control means for causing said digital signal from said analog-to-digital conversion means to be written in said waveform memory means through one of said waveform read/write channels of said control means and causing said written digital signal to be read out from said waveform memory means through at least two of said waveform read/write channels of said control means;
said read control means including delay time setting means for setting delay times when said digital signal is read out from said waveform memory means through said at least two waveform read/write channels;
processing means including circuit means having a voltage controlled filter and a voltage controlled amplifier for each of said waveform read/write channels of said control means, an analog signal obtained through digital to analog conversion of said read/write digital signal being fed to said circuit means for control of timbre and tone volume independently for each channel; and
sounding means for converting output signals from said processing means into sound signals.

2. An effector comprising
analog-to-digital conversion means for converting an input analog waveform signal into a digital signal,
waveform memory means for storing the digital signal provided from said analog-to-digital conversion means and providing a predetermined effect on an acoustic signal produced on the basis of the digital signal when read out from said waveform memory means,
control means having a plurality of waveform read/write channels for effecting the reading and writing of said digital signals with respect to said waveform memory means;

read control means for causing said digital signal from said analog-to-digital conversion means to be written in said waveform memory means through one of said waveform read/write channels of said control means and causing said written digital signal to be read out from said waveform memory means through at least two other said waveform read-write channels of said control means;

said read control means including means for causing said digital signal from said analog-to-digital conversion means to be written in said waveform memory means at a predetermined rate through one of said waveform read/write channels of said control means and means for causing said digital signal written in said waveform memory means to be read out at rates different from said predetermined rate through at least two said waveform read/write channels of said control means; and sounding means for converting the digital signals read out through at least two said waveform read/write channels into analog signals to be sounded;

wherein said read control means further includes delay time setting means for setting delay times when said digital signal is read out from said waveform memory means through at least two said waveform read/write channels.

3. The effector according to claim 2, wherein:

said digital signal obtained from said analog-to-digital conversion means is fed together with the digital signals read out from said waveform memory means through said at least two waveform read/write channels of said control means to said sounding means to be sounded.

4. The effector according to claim 2, wherein:

said sounding means includes processing means for effecting a predetermined processing on the digital signals read out from said waveform memory means for control of at least timbre and tone volume independently for a plurality of waveform read/write channels of said control means.

5. The effector according to claim 2, wherein:

said effector further comprises digital multiplication means for multiplying said digital signals read out through at least two said waveform read/write channels by multiplication data with the values thereof determined independently.

6. The effector according to claim 2, wherein:

the rates at which said digital signal is read out from said waveform memory means through at least two said waveform read/write channels of said control means are varied with time, thereby providing a frequency modulation to the sound output of said sounding means.

7. An effector comprising analog-to-digital conversion means for converting an input analog waveform signal into a digital signal, waveform memory means for storing the digital signal provided from said analog-to-digital conversion means and providing a predetermined effect on an acoustic signal produced on the basis of the digital signal when read out from said waveform memory means, control means having a plurality of waveform read/write channels for effecting the reading and writing of said digital signal with respect to said waveform memory means;

read control means for causing said digital signal from said analog-to-digital conversion means to be written in said waveform memory means through one of said waveform read/write channels of said control means and causing said written digital signal to be read out from said waveform memory means through at least two other said waveform read/write channels of said control means;

said read control means including means for causing said digital signal from said analog-to-digital conversion means to be written in said waveform memory means at a predetermined rate through one of said waveform read/write channels of said control means and means for causing said digital signal written in said waveform memory means to be read out at rates different from said predetermined rate through at least two said waveform read/write channels of said control means; and sounding means for converting said digital signals read out through at least two said waveform read/write channels into analog signals to be sounded;

wherein said sounding means includes voltage controlled filters each provided for each of said waveform read/write channels of said control means and capable of independent variation of filter characteristics, and said digital signals read out through said at least two waveform read/write channels are converted into analog signals and then filtered through corresponding said voltage controlled filters before being sounded;

said digital signal obtained from said analog-to-digital conversion means is subjected to digital-to-analog conversion together with the digital signals read out from said waveform memory means through at least two said waveform read/write channels of said control means before being fed to corresponding ones of said voltage controlled filters for filtering; and said read control means includes delay time setting means for setting variable delay times when said digital signal is read out from said waveform memory means through at least two said waveform read/write channels.

8. An effector comprising analog-to-digital conversion means for converting an input analog waveform signal into a digital signal, waveform memory means for storing the digital signal provided from said analog-to-digital conversion means and providing a predetermined effect on an acoustic signal produced on the basis of the digital signal when read out from said waveform memory means, control means having a plurality of waveform read/write channels for effecting the reading and writing of said digital signal with respect to said waveform memory means;

read control means for causing said digital signal from said analog-to-digital conversion means to be written in said waveform memory means through one of said waveform read/write channels of said control means and causing said written digital signal to be read out from said waveform memory means through at least two other said waveform read/write channels of said control means;

said read control means including means for causing said digital signal from said analog-to-digital conversion means to be written in said waveform memory means at a predetermined rate through one of said waveform read/write channels of said control means and means for causing said digital signal written in said waveform memory means to be read out at rates different from said predetermined rate through at least two said waveform read/write channels of said control means; and sounding means for converting the digital signals read out through at least two said waveform read/write channels into analog signals to be sounded;

wherein said effector further comprises digital multiplication means for multiplying said digital signals read out through at least two said waveform read/write channels by multiplication data with the values thereof determined independently;

said digital signal obtained from said analog-to-digital conversion means is fed together with said digital signals read out from said waveform memory means through at least two said waveform read/write channels of said control means to said digital multiplication means for multiplication by said corresponding multiplication data; and said read control means includes delay time setting means for setting delay times when reading out said digital signal form said waveform memory means through at least two said waveform read/write channels.

9. An effector comprising analog-to-digital conversion means for converting an input analog waveform signal into a digital signal, waveform memory means for storing the digital signal provided from said analog-to-digital conversion means and providing a predetermined effect on an acoustic signal produced on the basis of the digital signal when read out from said waveform memory means, control means having a plurality of waveform read/write channels for effecting the reading and writing of said digital signal with respect to said waveform memory means;

read control means for causing said digital signal from said analog-to-digital conversion means to be written in said waveform memory means through one of said waveform read/write channels of said control means and causing said written digital signal to be read out from said waveform memory means through at least two other said waveform read/write channels of said control means;

said read control means including means for causing said digital signal from said analog-to-digital conversion means to be written in said waveform memory means at a predetermined rate through one of said waveform read/write channels of said control means and means for causing said digital signal written in said waveform memory means to be read out at rates different from said predetermined rate through at least two said waveform read/write channels of said control means; and sounding means for converting the digital signals read out through at least two said waveform read/write channels into analog signals to be sounded;

wherein said effector further comprises feedback means for reading out said digital signal written in said waveform memory means, combining said read-out digital signal with said digital signal obtained through conversion of said input waveform signal and writing the resultant signal in said waveform memory means; and said feedback means includes delay time setting means for setting variable delay times when reading out said digital signal from said waveform memory means through at least two said waveform read/write channels.

10. An effector comprising sampling means for receiving an input signal and sampling said input signal at a predetermined sampling frequency;

memory means for storing a digital waveform signal provided from said sampling means;

output means for reading out said digital signal written in said waveform memory means as at least two digital waveform signals and providing said read-out digital waveform signals with a predetermined effect;

said output means including means for causing said digital waveform signal from said sampling means to be written in said memory means at a predetermined rate and means for causing said digital waveform signal written in said memory means to be read out at a rate different from said predetermined rate; and sounding means for obtaining a sound output on the basis of waveform signals provided from said output means; and said output means includes delay time setting means for setting variable delay times when reading out said digital signal as at least two said digital waveform signals.

11. The effector according to claim 10, wherein:

said output means reads out a plurality of digital waveform signals simultaneously from said waveform memory means through a time division multiplexing of a plurality of channels.

12. The effector according to claim 10, wherein:

said effector further comprises feedback means for feeding back waveform signals provided from said plurality of voltage controlled filters to said sampling means.

13. The effector according to claim 10, wherein the rate at which said digital waveform signal is read out from said memory means is varied with time, so that frequency modulation is provided to the output sound.

14. A digital effector comprising analog-to-digital conversion means for sampling an input waveform signal at a predetermined sampling frequency for conversion into a digital signal;

waveform memory means for storing a digital signal provided from said analog-to-digital conversion means;

control means including a plurality of waveform read/write channels for writing and reading said digital signal with respect to said waveform memory means;

read control means for causing said digital signal from said analog-to-digital conversion means to be written in said waveform memory means through one of said waveform read/write channels of said control means add causing said digital signal written in said waveform memory means to be read out through at least two of said waveform read/write channels of said control means;

said read control means including means for causing said digital signal from said analog-to-digital conversion means to be written in said waveform memory means at a predetermined rate through one of said waveform read/write channels of said control means and means for causing said digital signal written in said waveform memory means to be read out at rates different from said predetermined rate through at least two said waveform read/write channels of said control means; and digital multiplication means for multiplying the digital signals read out through at least two said waveform read/write channels by multiplication data having independently determined values;

wherein said read control means includes delay time setting means for setting delay times when reading said digital signal from said waveform memory means through at least two said waveform read/write channels.

15. A digital effector comprising analog-to-digital conversion means for sampling an input waveform signal at a predetermined sampling frequency for conversion into a digital signal;

waveform memory means for storing a digital signal provided from said analog-to-digital conversion means;

control means including a plurality of waveform read/write channels for writing and reading said digital signal with respect to said waveform memory means;

read control means for causing said digital signal from said analog-to-digital conversion means to be written in said waveform memory means through one of said waveform read/write channels of said control means and causing said digital signal written in said waveform memory means to be read out through at least two of said waveform read/write channel of said control means;

said read control means including means for causing said digital signal from said analog-to-digital conversion means to be written in said waveform memory means at a predetermined rate through one of said waveform read/write channels of said control means and means for causing said digital signal written in said waveform memory means to be read out at rates different from said predetermined rate through at least two said waveform read/write channels of said control means; and sounding means for converting the digital signals read out through at least two said waveform read/write channels into analog signals to be sounded;

wherein said digital signal obtained from said analog-to-digital conversion means is fed together with the digital signals read out from said waveform memory means through at least two said waveform read/write channels of said control means to said sounding means to be sounded; and said control means includes delay time setting means for setting variable delay times when reading out said digital signal from said waveform memory means through at least two said waveform read/write channels.

16. A digital effector, in which an input waveform signal is converted into a digital signal, said digital signal is written in waveform memory means at a predetermined rate, and said digital signal written in said waveform memory means is read out and converted into an analog signal before being sounded, wherein:

said digital effector comprises feedback means for reading out said digital signal written in said waveform memory means at a rate different from said predetermined rate, digitally synthesizing said read-out digital signals with said digital signal obtained through conversion of said input waveform signal and feeding back the resultant signal to said waveform memory means; and said digital effector further comprises delay time setting means for setting delay times when reading out at least two digital signals from said waveform memory means.

* * * * *

UNITED STATES PATENT AND TRADEMARK OFFICE
CERTIFICATE OF CORRECTION

PATENT NO. : 4,864,625
DATED : September 5, 1989
INVENTOR(S) : HANZAWA et al

It is certified that error appears in the above-identified patent and that said Letters Patent is hereby corrected as shown below:

In the title page, under "Foreign Application Priority Data", delete the following:

"Sep. 13, 1985 [JP] Japan.....60-202700"
"Sep. 14, 1985 [JP] Japan.....60-203791"
"Sep. 18, 1985 [JP] Japan.....60-205517"
"Sep. 27, 1985 [JP] Japan.....60-214311"

Signed and Sealed this

Eighteenth Day of December, 1990

Attest:

HARRY F. MANBECK, JR.

*Attesting Officer*     *Commissioner of Patents and Trademarks*